US009423474B2

(12) United States Patent
Paci et al.

(10) Patent No.: US 9,423,474 B2
(45) Date of Patent: Aug. 23, 2016

(54) INTEGRATED MULTILAYER MAGNETORESISTIVE SENSOR AND MANUFACTURING METHOD THEREOF

(71) Applicant: STMicroelectronics S.r.l., Agrate Brianza (IT)

(72) Inventors: Dario Paci, Cornaredo (IT); Sarah Zerbini, Fontanellato (IT); Benedetto Vigna, Potenza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 387 days.

(21) Appl. No.: 13/929,635

(22) Filed: Jun. 27, 2013

(65) Prior Publication Data
US 2014/0015525 A1 Jan. 16, 2014

(30) Foreign Application Priority Data

Jul. 11, 2012 (IT) ............... TO2012A0614

(51) Int. Cl.
*G01R 33/09* (2006.01)
*G01R 33/00* (2006.01)
*G01R 33/02* (2006.01)

(52) U.S. Cl.
CPC .......... *G01R 33/096* (2013.01); *G01R 33/0017* (2013.01); *G01R 33/0206* (2013.01)

(58) Field of Classification Search
CPC .............................. G01R 33/096; G01R 33/09
USPC .......................... 324/252, 228, 247
See application file for complete search history.

(56) References Cited

U.S. PATENT DOCUMENTS

| 4,847,584 | A | | 7/1989 | Pant |
| 5,247,278 | A | * | 9/1993 | Pant et al. ............... 338/32 R |
| 5,570,034 | A | * | 10/1996 | Needham et al. ........ 324/762.02 |
| 5,952,825 | A | | 9/1999 | Wan |
| 6,529,114 | B1 | | 3/2003 | Bohlinger et al. |
| 7,990,139 | B2 | * | 8/2011 | Abe et al. ................. 324/252 |
| 2005/0270020 | A1 | | 12/2005 | Peczalski et al. |
| 2010/0327864 | A1 | | 12/2010 | Vigna et al. |
| 2012/0161756 | A1 | | 6/2012 | Paci et al. |

FOREIGN PATENT DOCUMENTS

WO 2012/085296 A1 6/2012

* cited by examiner

*Primary Examiner* — Arleen M Vazquez
*Assistant Examiner* — Brent J Andrews
(74) *Attorney, Agent, or Firm* — Seed IP Law Group PLLC

(57) ABSTRACT

A magnetic-field sensor includes: a chip including a substrate having a first surface and an insulating layer covering the first surface; first and second magnetoresistors each extending into the insulating layer and having a main axis of magnetization and a secondary axis of magnetization; a first magnetic-field generator configured to generate a first magnetic field having field lines along the main axis of magnetization of the first magnetoresistor; a second magnetic-field generator configured to generate a second magnetic field having field lines along the main axis of magnetization of the second magnetoresistor. The main axes of magnetization extending transversely to each other and the secondary axes of magnetization extending transversely to each other. The first and second magnetoresistors extend into the insulating layer at a first distance and a second distance, respectively, that differ from one another, from the first surface.

27 Claims, 22 Drawing Sheets

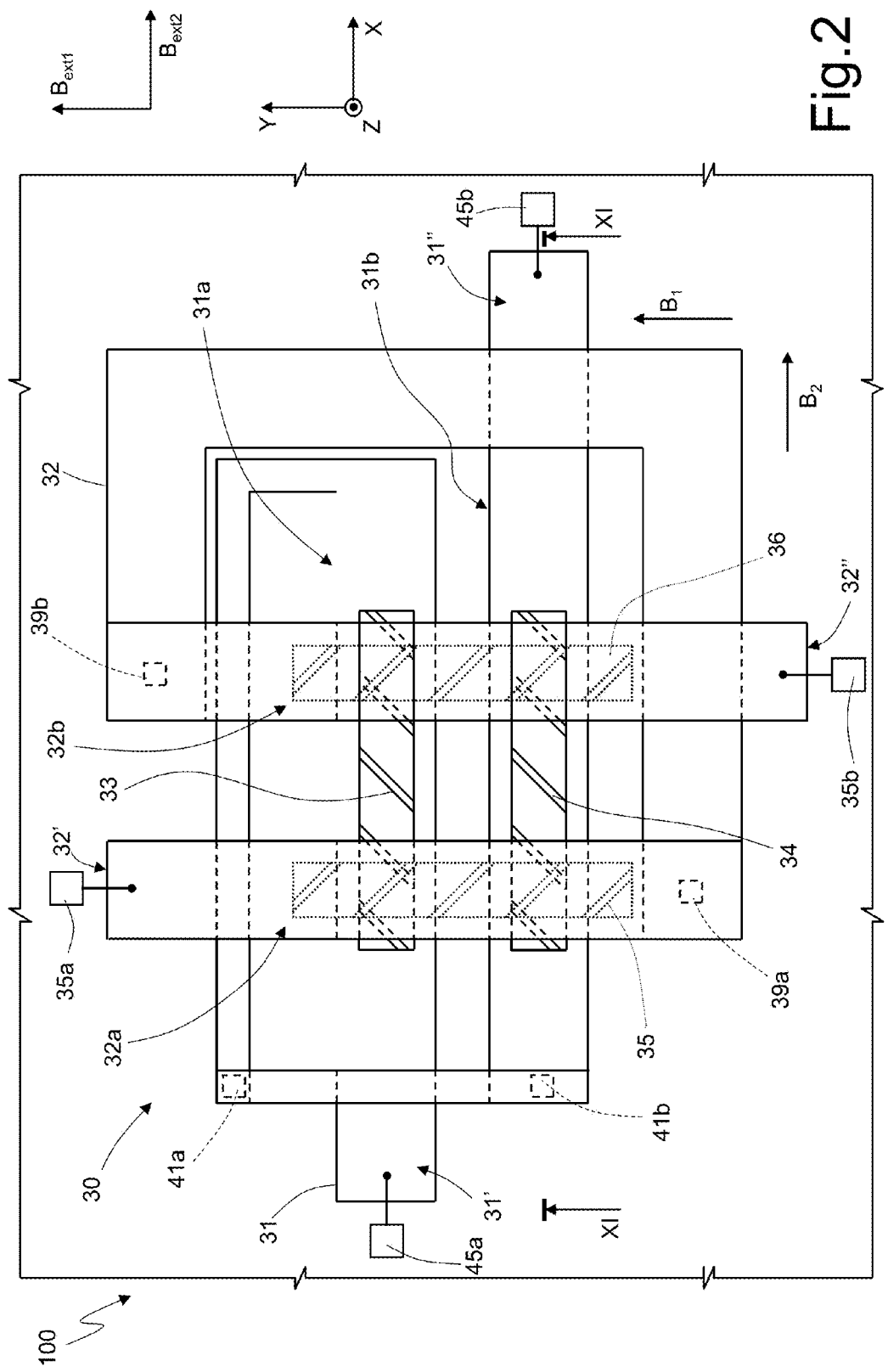

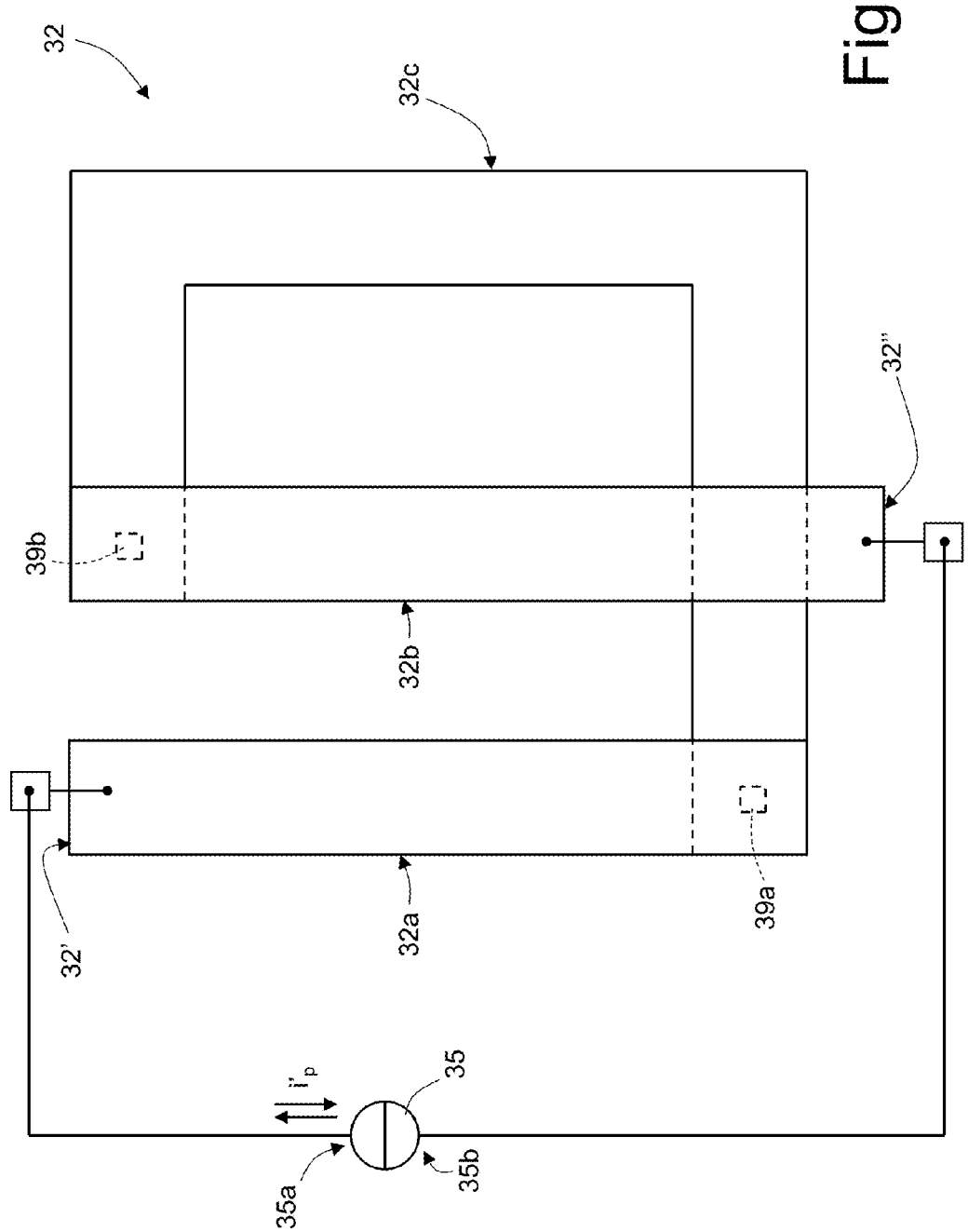

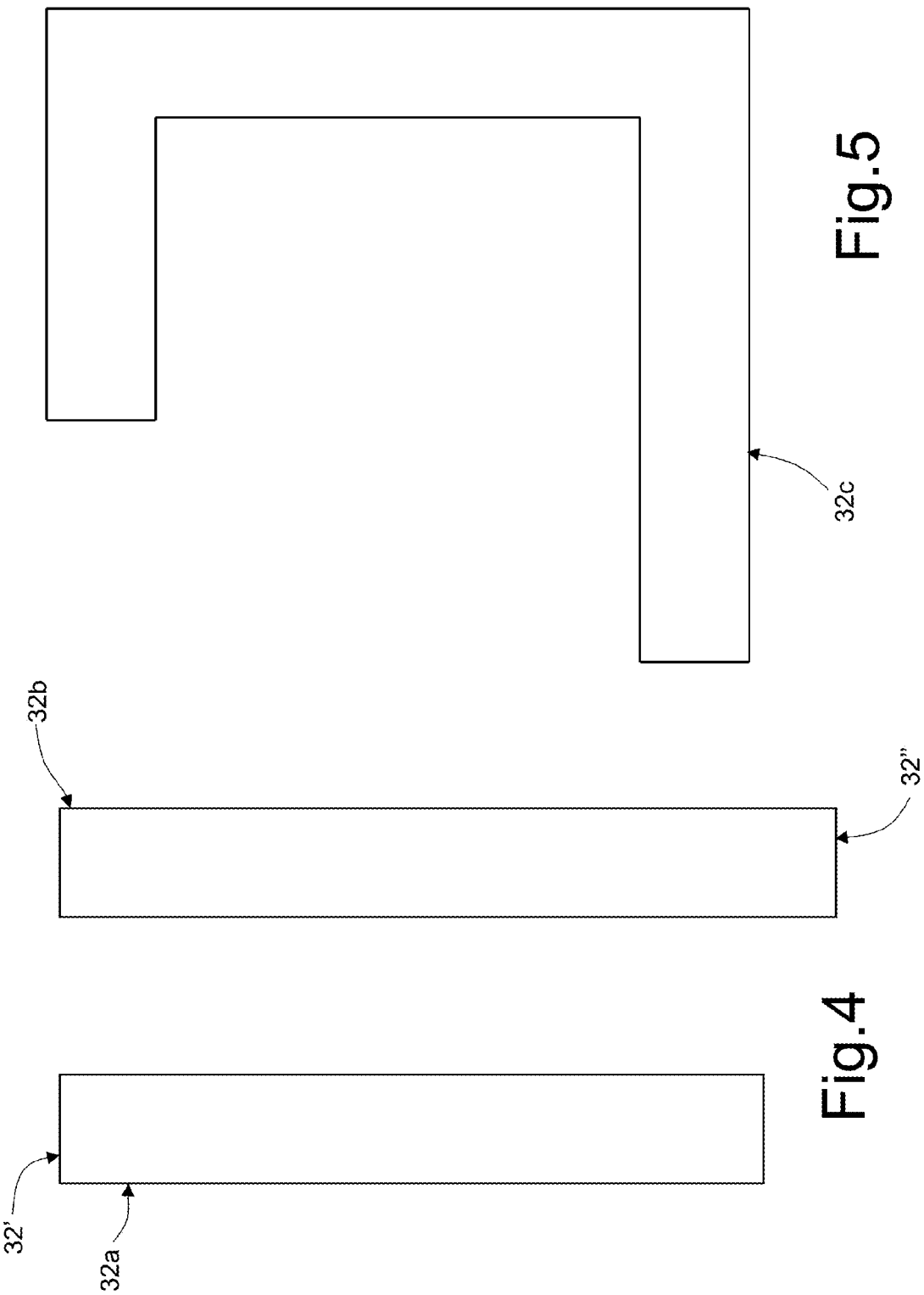

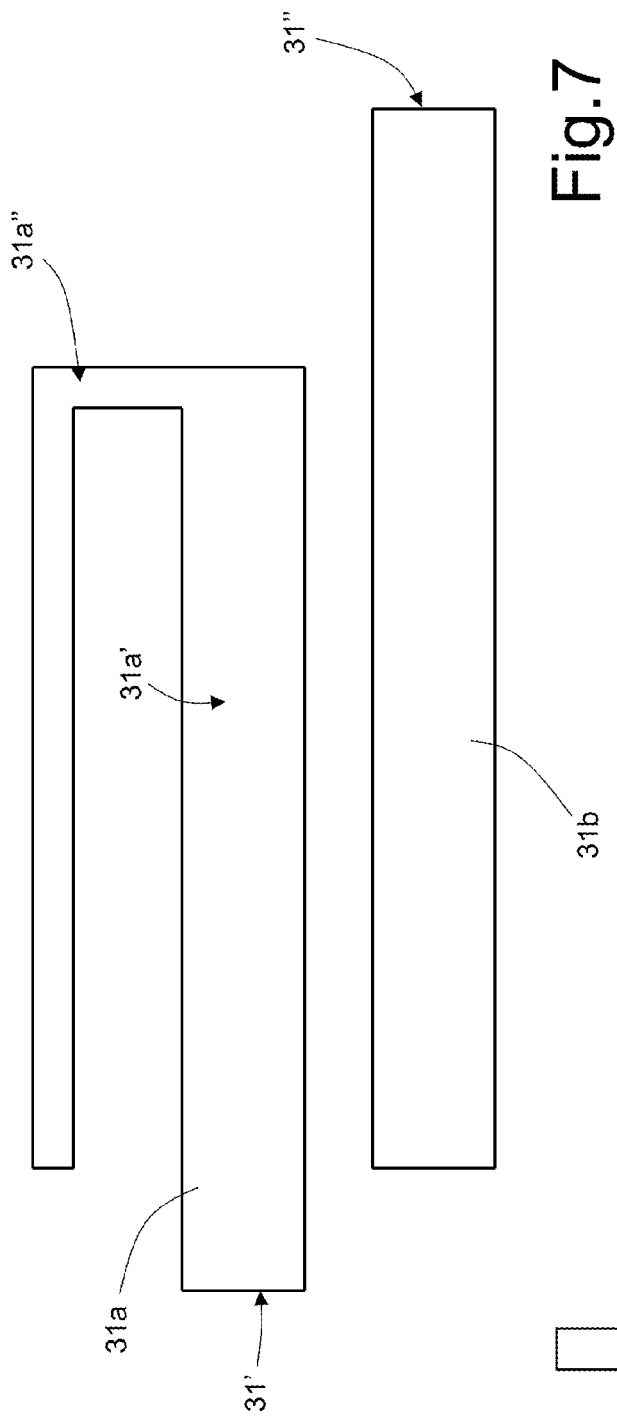
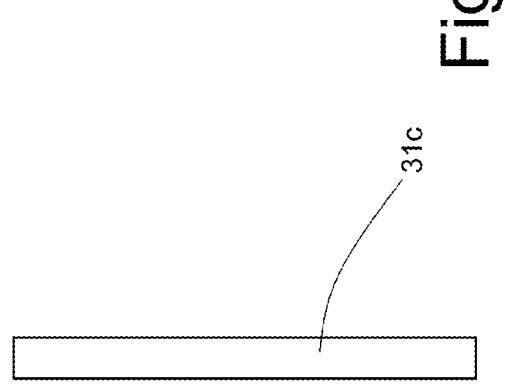

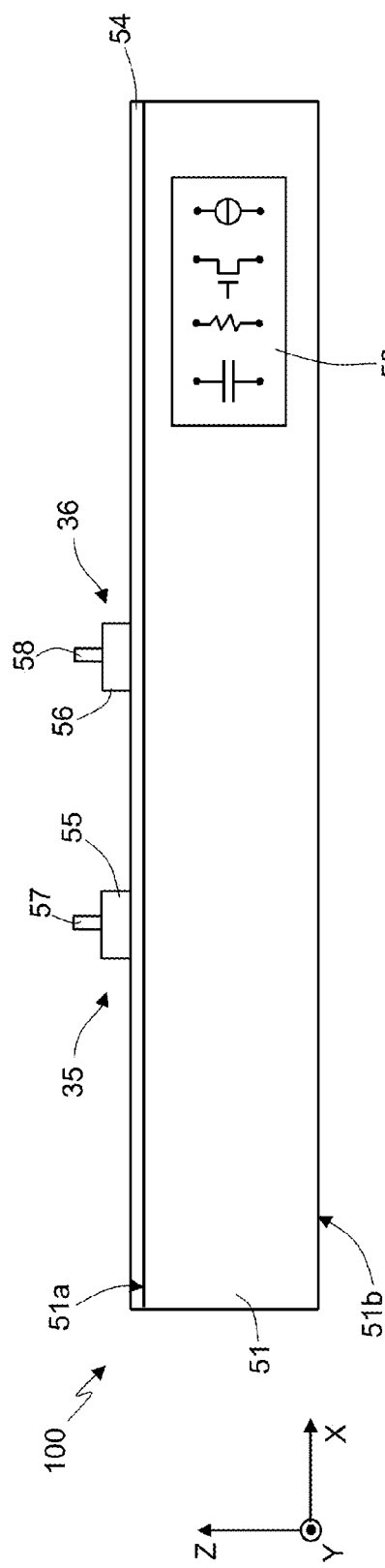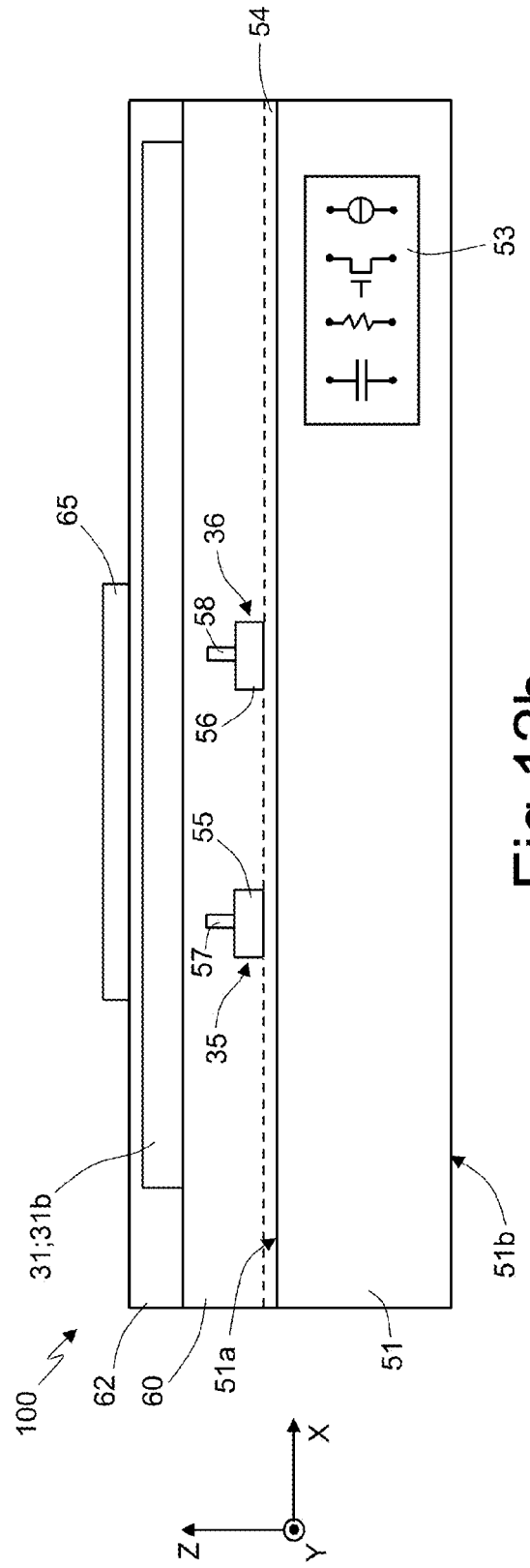

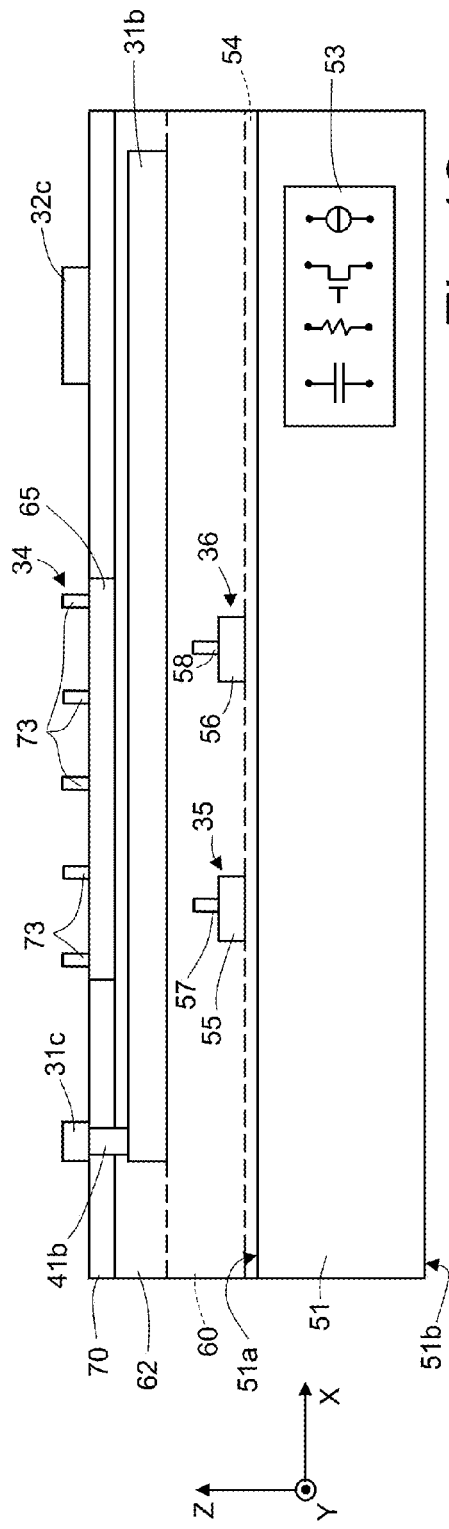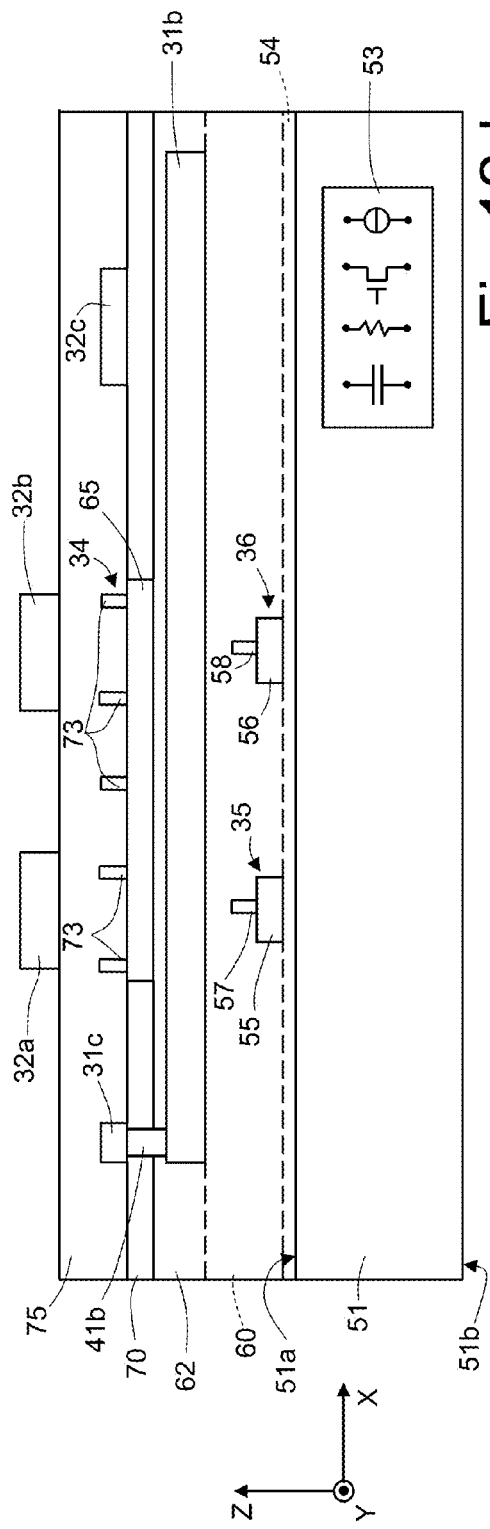

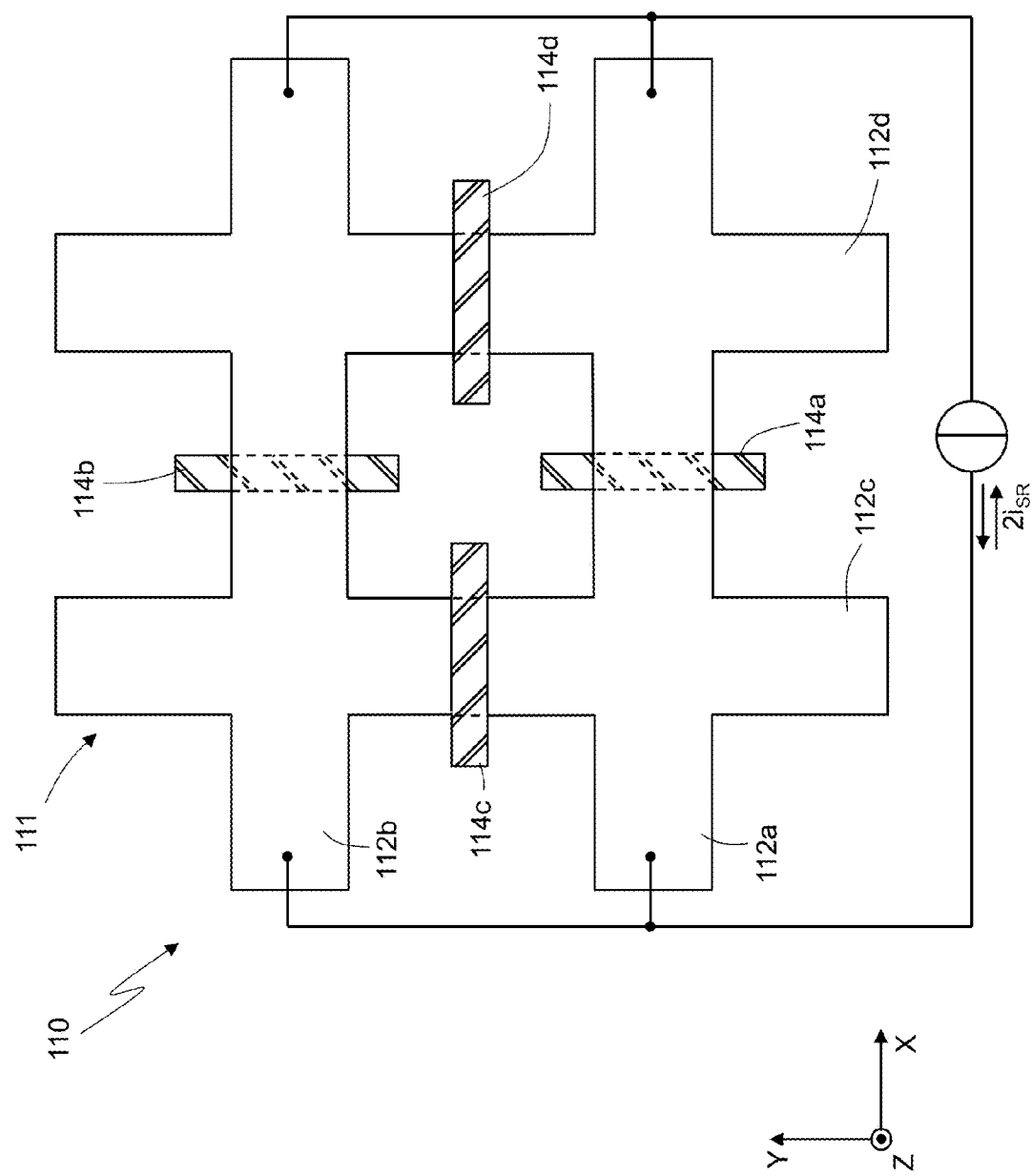

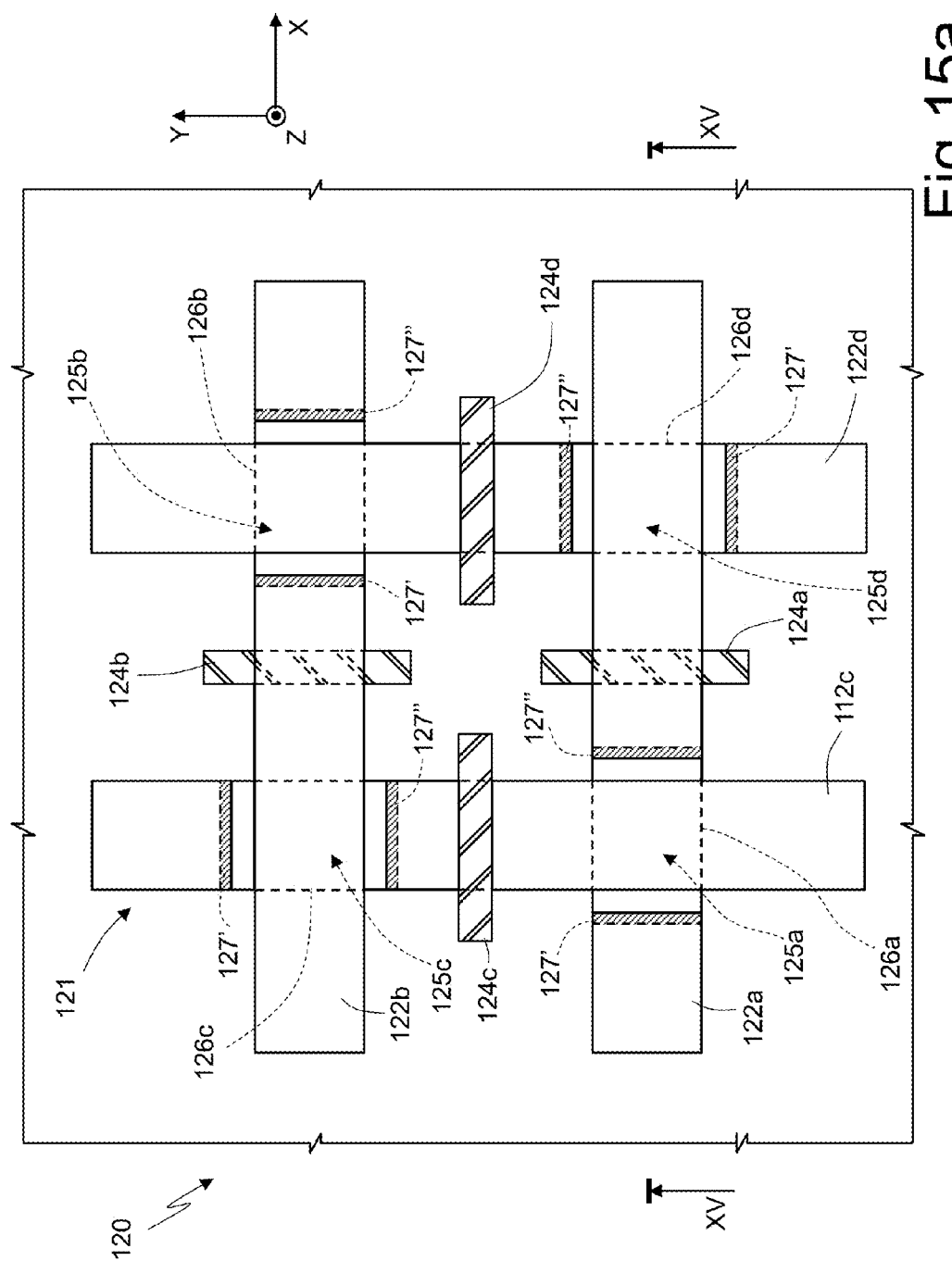

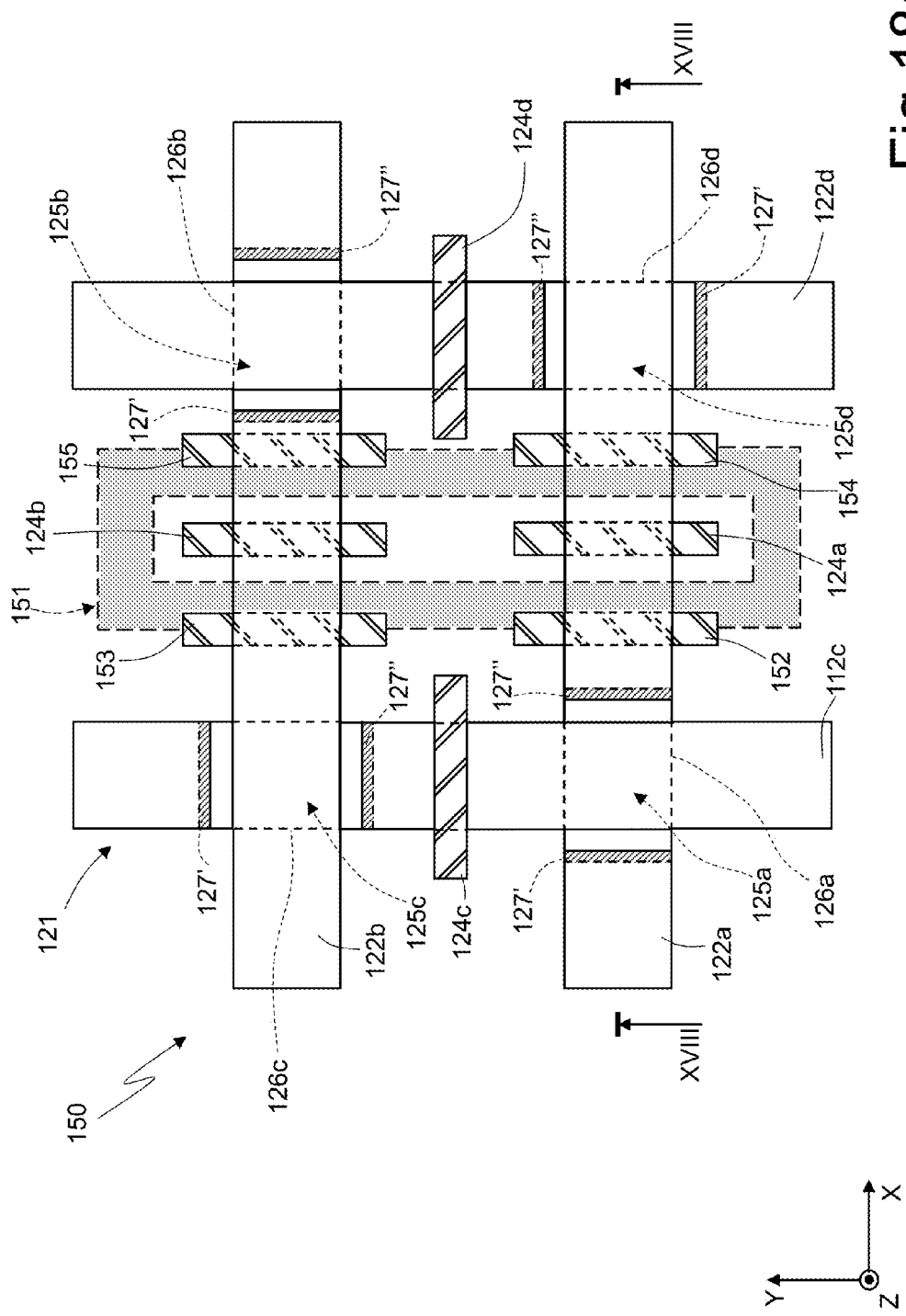

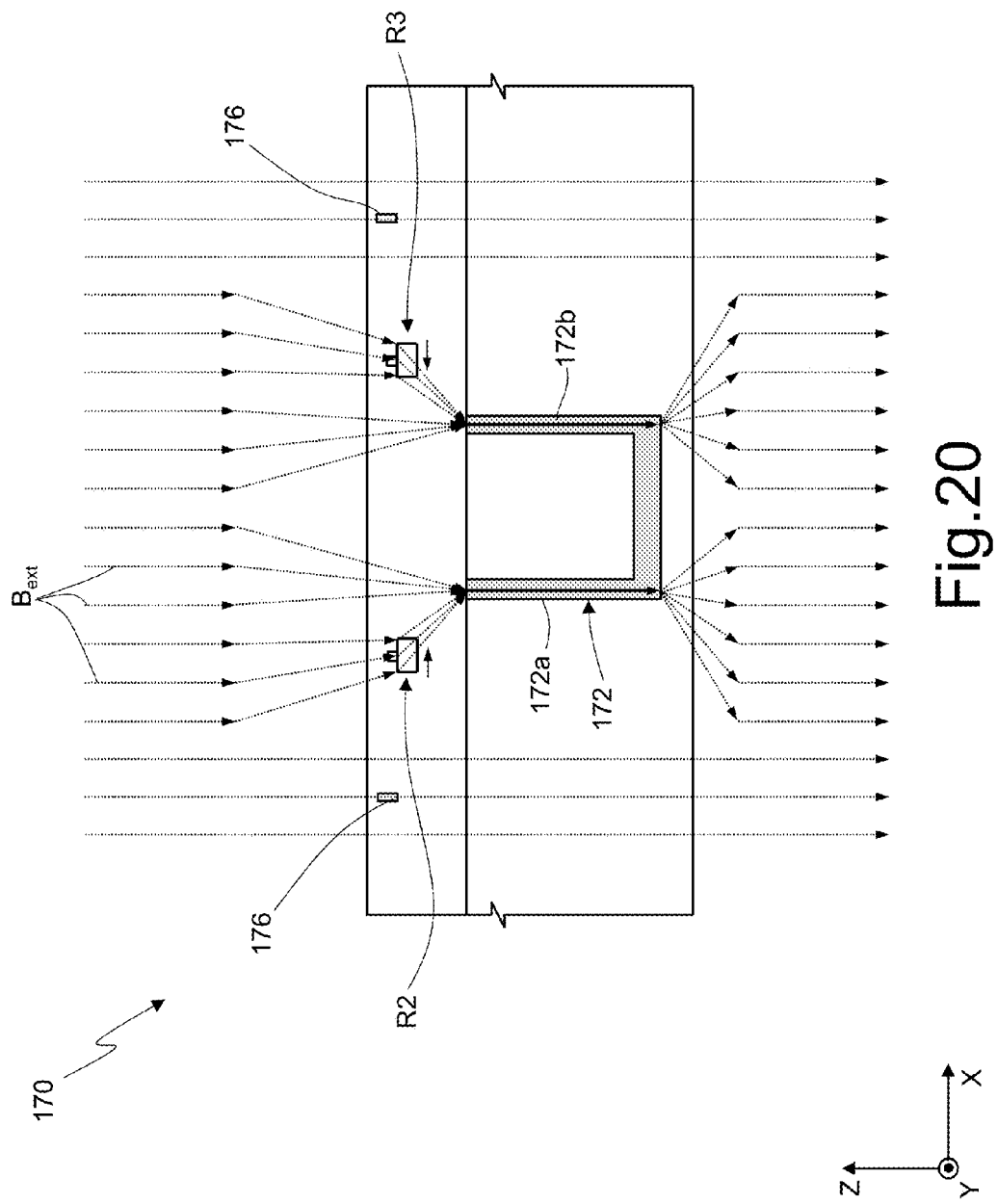

INTEGRATED MULTILAYER MAGNETORESISTIVE SENSOR AND MANUFACTURING METHOD THEREOF

BACKGROUND

1. Technical Field

The present disclosure relates to an integrated multilayer magnetoresistive sensor and to the manufacturing method thereof, more in particular to a magnetic-field sensor comprising anisotropic magnetoresistive elements.

2. Description of the Related Art

Magnetic-field sensors of an AMR (anisotropic magnetoresistance) type are used in a plurality of applications and systems, for example, in compasses, in systems for detecting ferromagnetic materials, in the detection of currents and in a wide range of other applications, thanks to their capacity for detecting natural magnetic fields (for example, the Earth's magnetic field) and magnetic fields generated by electrical components (such as electrical or electronic devices and lines traversed by electric current).

In a known way, the phenomenon of anisotropic magnetoresistivity occurs within particular ferromagnetic materials, which, when subjected to an external magnetic field, undergo a variation of resistivity according to the characteristics of the applied magnetic field. Usually, said materials are shaped in thin strips so as to form resistive elements and the resistive elements thus formed are electrically connected together to form a bridge structure (typically a Wheatstone bridge).

It is moreover known to obtain AMR magnetic sensors with standard techniques of micromachining of semiconductors, as described for example, in the document No. U.S. Pat. No. 4,847,584. In particular, each magnetoresistive element can be formed by a film of magnetoresistive material, such as for example, permalloy (a ferromagnetic alloy containing iron and nickel), deposited to form a thin strip on a substrate of semiconductor material, for example, silicon.

When an electric current is made to flow through a magnetoresistive element, the angle $\theta$ between the direction of magnetization of said magnetoresistive element and the direction of the flow of the current affects the effective value of resistivity of said magnetoresistive element, so that, as the value of the angle $\theta$ varies, the value of electrical resistance varies (in detail, said variation follows a law of the $\cos^2\theta$ type).

For example, a direction of magnetization parallel to the direction of the flow of current results in a maximum value of resistance to the passage of current through the magnetoresistive element, whereas a direction of magnetization orthogonal to the direction of the flow of current results in a minimum value of resistance to the passage of current through the magnetoresistive element.

AMR magnetic sensors moreover include a plurality of coils integrated in said sensors (typically two coils), referred to as "set/reset strap" and "offset strap" and designed to generate, when traversed by a current of appropriate value, a magnetic field that couples in a direction perpendicular to the direction of detection of the sensors and, respectively, in the direction of detection of the sensors; in this regard, see for example, the document No. U.S. Pat. No. 5,247,278.

The set/reset strap has the function of varying, by alternating it, the sense of magnetization of the magnetoresistive elements in a first predefined direction (the so-called "easy axis" or EA). In use, the variation of the sense of magnetization is obtained by applying to the magnetoresistive element, via the set/reset strap, a magnetic field of appropriate value for a short period of time, such as to force arbitrarily the sense of the magnetic dipoles of the magnetoresistive element in the first predefined direction (set operation) and, subsequently, by applying to the magnetoresistive element a second magnetic field, like the previous one but with opposite sense, so as to force the sense of the magnetic dipoles of the magnetoresistive element once again in the first predefined direction, but with opposite sense (reset operation).

The set and reset operations have the function of bringing each magnetoresistive element of the AMR sensor into a respective single-domain state before operating the AMR sensor, for example, in order to carry out operations of sensing of an external magnetic field. The set and reset operations are used in so far as only in the single-domain state the fundamental properties of linearity, sensitivity and stability of the magnetoresistive elements are controlled and repeatable. The aforementioned set and reset operations are known and described in detail for example, in the document No. U.S. Pat. No. 5,247,278.

The offset strap is normally used for operations of compensation of the offset present in the AMR sensor (on account of mismatch in the values of the corresponding electrical components), self-test operations and/or operations of calibration of the AMR sensor. In particular, the value of the electrical quantities at output from the AMR sensor is, in the presence of the offset strap, a function both of the external magnetic field to be sensed and of the magnetic field generated as a result of a current circulating in the offset strap. The offset strap is formed by turns of conductive material, for example, metal, arranged on the same substrate as that on which the magnetoresistive elements of the sensor and the set/reset strap are provided (in different metal levels) and is electrically insulated from and set in the proximity of, said magnetoresistive elements. The magnetic field generated by the offset strap is such as to force partially the orientation of the magnetic dipoles of each magnetoresistive element in a second predefined direction (the so-called "hard axis" or HA), orthogonal to the first predefined direction.

FIG. 1 shows, in top plan view, a layout exemplifying an integrated magnetic-field sensor 1 of a known type and comprising a plurality of magnetoresistive elements, connected together so as to form a Wheatstone bridge, for example, as described in the document No. U.S. Pat. No. 5,247,278 and the document No. U.S. Pat. No. 5,952,825 and manufactured as described, for example, in the document No. U.S. Pat. No. 4,847,584.

More in particular, each magnetoresistive element has a structure of the barber-pole type. The barber-pole structure for magnetoresistive elements is known. In this case, each magnetoresistive element is formed by a strip made of magnetoresistive material (typically an NiFe alloy), arranged on which, in direct electrical contact, are conductive elements with high electrical conductivity (for example, made of aluminum, copper, silver, or gold).

Said conductive elements extend in a direction transverse to the axis of spontaneous magnetization of the magnetoresistive strip; in particular, they are inclined by a certain angle $\alpha$ (typically, $\alpha=45°$) with respect to the axis of spontaneous magnetization of the magnetoresistive strip.

The magnetic-field sensor 1 is formed on a semiconductor substrate 2 by micromachining processes of a known type. Four magnetoresistive elements 4, 6, 8 and 10, in the form of strips of ferromagnetic material (for example, deposited thin films comprising an Ni/Fe alloy), in barber-pole configuration, are electrically connected together to form a Wheatstone bridge. For each magnetoresistive element 4, 6, 8, 10, the magnetoresistive strips that form it are connected in series to one another. With reference to FIG. 1, the magnetoresistive elements 4, 6, 8, 10 are interconnected and connected to terminals (or pads) 21, 22, 23, 24 and 25. The terminal 21 is connected to the magnetoresistive element 4 by a conductive path 11 and the magnetoresistive element 4 is connected to the magnetoresistive element 6 by a conductive portion 16. The conductive portion 16 is electrically connected to the terminal 22 by a respective conductive path 12. The magnetoresistive element 6 is then connected to the magnetoresistive element 10 by a conductive portion 18 and the conductive portion 18 is electrically connected to the terminal 23 by a respective conductive path 13. The magnetoresistive element 10 is interconnected with the magnetoresistive element 8 by a conductive portion 17 and the conductive portion 17 is electrically connected to the terminal 24 by a respective conductive path 14. The terminal 25 is connected to the magnetoresistive element 8 by a conductive portion 15.

In this way, a resistive Wheatstone-bridge structure is formed, which provides a magnetic-field sensor 1 sensitive to components of magnetic field having a direction perpendicular to the strips of ferromagnetic material that form the magnetoresistive elements 4, 6, 8, 10. The terminal 21 is connected to the terminal 25 to form a common terminal so as to connect electrically the magnetoresistive element 4 and the magnetoresistive element 8.

In use, an input voltage Vin is applied between the terminal 22 and the terminal 24. Reading of the output voltage Vout is made between the terminal 21 (common to the terminal 25) and the terminal 23.

With reference to FIG. 1, the magnetic-field sensor 1 further comprises a first strip of electrical conductive material, which extends over the substrate 2 and is insulated from the latter by a layer of dielectric material (not illustrated in detail in the figures). Said first strip of electrical conductive material forms a first winding 19, of a planar type, which extends in a plane parallel to the plane in which the magnetoresistive elements 4, 6, 8, 10 and is electrically insulated from the magnetoresistive elements 4, 6, 8, 10, lie.

The magnetic-field sensor 1 further comprises a second strip of electrical conductive material, which extends over the substrate 2 and is insulated from the latter and from the first winding 19 by a layer of dielectric material (not illustrated in detail in the figures). Said second strip of electrical conductive material forms a second winding 20, of a planar type, which extends between a terminal 20a and a terminal 20b in a plane parallel to the plane in which the magnetoresistive elements 4, 6, 8, 10 and the first winding 19 lie and is electrically insulated from the magnetoresistive elements 4, 6, 8, 10 and from the first winding 19.

The first winding 19 is used to generate a magnetic field having a known intensity interacting with the magnetic-field sensor 1, with purposes of biasing, calibration and/or compensation of possible offsets due to the presence of undesirable external magnetic fields. In the latter case, the effect of the magnetic field generated by the first winding 19 on the output signal Vout of the magnetic-field sensor 1 is that of balancing the output signal due exclusively to the undesirable external magnetic field in order to generate a zero output signal.

In use, when the first winding 19 is traversed by electric current, a magnetic field is generated, the lines of force of which have a component in the plane in which the magnetoresistive elements 4, 6, 8, 10 lie, in particular, in a direction parallel to the direction of sensitivity of the magnetoresistive elements 4, 6, 8, 10.

On account of the spread of the process of production of the magnetoresistive elements 4, 6, 8, 10, said magnetoresistive elements 4, 6, 8, 10 can present structural characteristics different from one another. This generates an offset signal Voff, superimposed on the useful output signal Vs, intrinsic to the magnetic-field sensor 1, which causes a reduction of the sensitivity of the magnetic-field sensor 1 during use. Said offset signal Voff can be eliminated by appropriately operating the second winding 20. In greater detail, during use, current pulses are made to flow in the second winding 20 with directions opposite to one another (by appropriately biasing the terminals 20a and 20b of the second winding) in such a way as to generate respective magnetic fields defined by respective field lines having senses opposite to one another. Said magnetic fields have an intensity such as to re-orient the magnetic dipoles of the magnetoresistive elements 4, 6, 8, according to the field lines generated, in particular with a sense defined by the sense of the lines of the magnetic field generated.

Following upon a first current pulse (referred to as set pulse) through the second winding 20, a first magnetic field $H_{S1}$ is generated such as to orient the magnetic dipoles of the magnetoresistive elements 4, 6, 8, 10 in a first sense.

Following upon a second current pulse (referred to as reset pulse) through the second winding 20, a second magnetic field $H_{S2}$ (of intensity, for example, equal to that of the first magnetic field $H_{S1}$) is generated such as to orient the magnetic dipoles of the magnetoresistive elements 4, 6, 8, 10 in a second sense.

The measurement made after the set step (signal taken from an output of the bridge) is equal to Voff+Vs, whereas after reset we find Voff−Vs. By subtracting the two measurements, the offset cancels out, thus obtaining 2Vs.

The AMR sensor described with reference to FIG. 1 hence requires, to be operated correctly, at least two straps (the set/reset strap and the offset strap).

The presence of a strap for the set/reset operations and of a strap for the operations of offset compensation complicates the process of manufacture of the AMR sensor and increases the production cost thereof. Moreover, also the dimensions of the sensor thus manufactured are not optimized.

The aforementioned disadvantages are even more evident in the case of two-axis sensor or three-axis sensor, designed to measure magnetic fields acting along two or, respectively, three axes. In this case, in fact, it would be necessary to provide at least one magnetoresistive element for each measuring axis and to provide a set/reset strap and an offset-compensation strap for each magnetoresistive element. It is evident that the occupation of area and manufacturing difficulties are, in this case, an important issue.

BRIEF SUMMARY

According to an embodiment of a known type, for example, described in U.S. Pat. No. 6,529,114, to overcome the aforementioned drawbacks and obtain a compact sensor, a single planar strap is formed having portions along a first axis (e.g., the axis X) and portions along a second axis (e.g., the axis Y) orthogonal to the first axis.

Magnetoresistive elements are formed both in the portions oriented along X and in the portions oriented along Y so that the magnetoresistive sensor can be used as biaxial sensor. All the magnetoresistive elements are coplanar and formed during one and the same step of deposition of ferromagnetic material. Said ferromagnetic material, before definition of the magnetoresistive strip (flat film), has the easy axis oriented in a direction typically forming an angle of 45° with respect to both of the axes of sensitivity of the ferromagnetic element. The shape of the magnetoresistive elements, where the extension L along the easy axis is greater than the extension W along the hard axis, with L>>W, introduces a "shape anisotropy", which, combining with the anisotropy of the material (flat film) tends to bring the easy axis of the strips that are sensitive to the field along X (which have an extension L parallel to Y) along Y and the easy axis of the strips that are sensitive to the field along Y (which have an extension L parallel to X) along X. In this way, it is possible to operate the sensor as biaxial sensor.

However, the solution obtained is not optimal in so far as further steps of compensation of the signal generated by the magnetoresistive elements are desirable on account of the fact that, even though the geometrical anisotropy orients the easy axis of the magnetoresistive elements that are sensitive to the field along X orthogonal to the easy axis of the magnetoresistive elements sensitive to the field along Y, the orthogonality is not perfect unless the magnetoresistive elements are set at an angle of a few degrees greater than 90°. Furthermore, a sensor of this type does not enable any scaling down of less than approximately 0.7×0.7 mm².

One embodiment of the present disclosure is a magnetoresistive sensor and a method for manufacturing the same that are free from the drawbacks of the known art.

According to the present disclosure, a magnetoresistive sensor and a method for manufacturing the same are provided, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 2 shows, in schematic top-plan view, a magnetic-field sensor according to one embodiment of the present disclosure;

FIG. 3 shows, in schematic top-plan view, a magnetic-field generator in the form of a conductive strip of the magnetic-field sensor of FIG. 2;

FIG. 4 shows coplanar portions of the magnetic-field generator of FIG. 3;

FIG. 5 shows a further portion of the magnetic-field generator of FIG. 3, designed to couple electrically the coplanar portions of FIG. 4;

FIG. 7 shows coplanar portions of the magnetic-field generator of FIG. 6;

FIG. 8 shows a further portion of the magnetic-field generator of FIG. 6, designed to couple electrically the coplanar portions of FIG. 7;

FIGS. 12a-12d show, in cross-sectional view, steps of manufacture of the magnetic-field sensor of FIGS. 2 and 11;

FIGS. 14a, 14b show the sensor of FIG. 13 during use for the set/reset operation and the offset-compensation operation;

FIG. 15a shows, in schematic top-plan view, a magnetic-field sensor according to a further embodiment of the present disclosure;

FIGS. 18a and 18b show, in top-plan view and in cross-sectional view, respectively, a magnetic-field sensor according to a further embodiment of the present disclosure;

FIG. 20 shows a cross-sectional view of the sensor of FIG. 18 along the line of cross section XIX-XIX.

DETAILED DESCRIPTION

Figure 1:
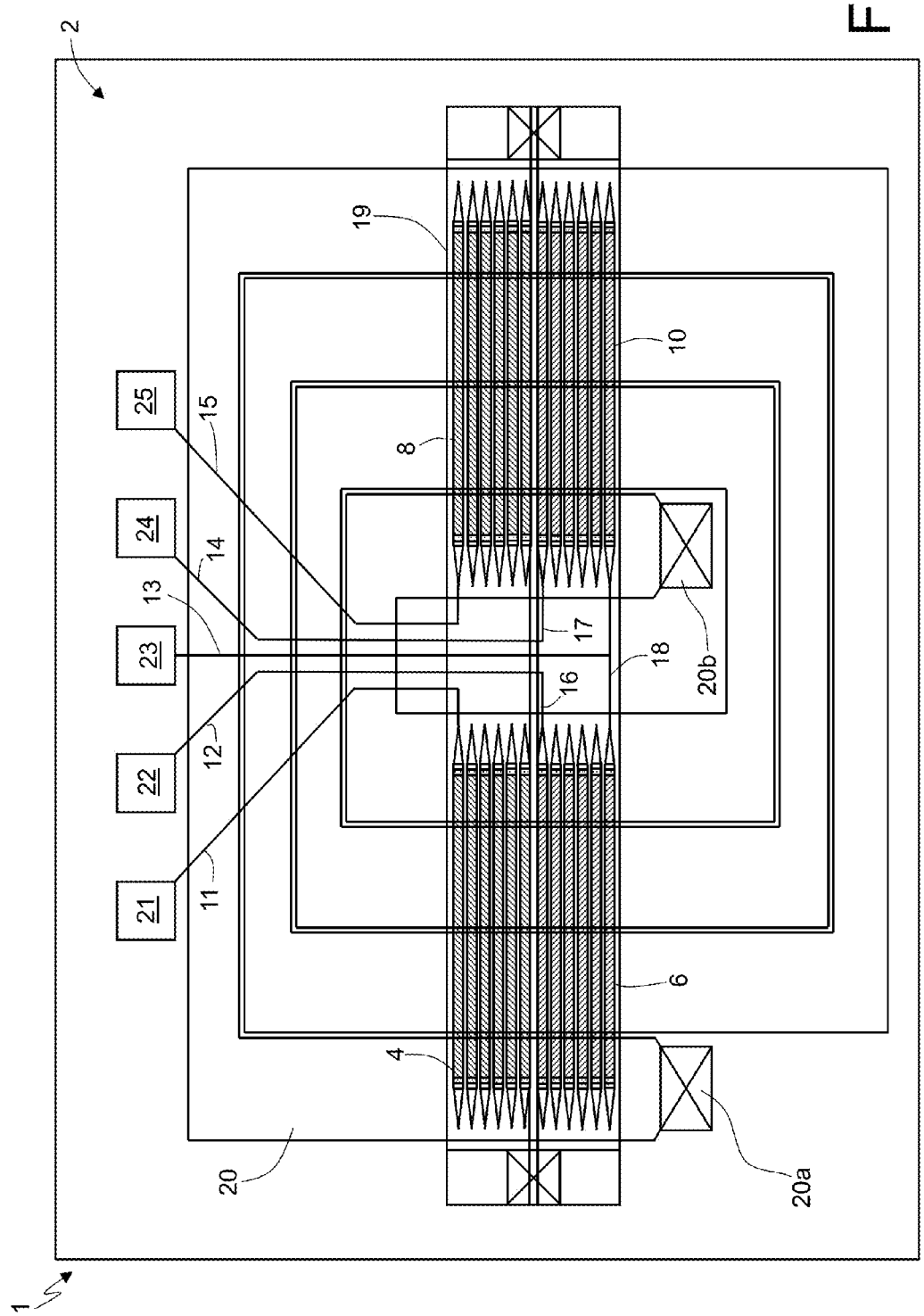
FIG. 1 shows a magnetic-field sensor of an AMR type according to the known art.

FIG. 2 shows, in top-plan view and in schematic form, a portion of a magnetic-field sensor 30 formed in a wafer 100 comprising a plurality of metal levels separated from one another by dielectric layers, according to one embodiment of the present disclosure.

The magnetic-field sensor 30 is, in particular, a two-axis sensor designed to sense external magnetic fields $B_{ext1}$ and $B_{ext2}$ acting in two mutually perpendicular directions (in particular, in the representation of FIG. 2, along the axes Y and X, respectively).

The magnetic-field sensor 30 comprises a first magnetic-field generator 31 and a second magnetic-field generator 32. The first magnetic-field generator 31 is formed by planar conductive strips extending in a plurality of metal levels, as described more fully hereinafter, for example, with reference to FIGS. 3 and 4. The second magnetic-field generator 32 is also formed by planar conductive strips extending in a plurality of metal levels at least in part different from the metal levels in which the first magnetic-field generator 31 extends (see, for example, FIGS. 6 and 7 and the corresponding description).

The magnetic-field sensor 30 further comprises a first magnetoresistive element (or simply magnetoresistor) and a second magnetoresistive element (or simply magnetoresistor) 33, 34, each of which includes a respective barber-pole structure. The first and second magnetoresistive elements 33, 34 extend on top of, in top-plan view along the axis Z, conductive portions 31a, 31b of the first magnetic-field generator 31 and, respectively, conductive portions 32a, 32b of the second magnetic-field generator 32.

In greater detail, the magnetoresistive elements 33, 34 are set on top of the first magnetic-field generator 31 and the second magnetic-field generator 32 so that a preferred axis of magnetization (in particular, the easy axis EA) of each respective magnetoresistive element 33, 34 extends perpendicular to the lines of flux of a magnetic field $B_1$ (i.e., the EA is parallel to the axis X) generated by the conductive portions 31a, 31b when the first magnetic-field generator 31 is traversed by electric current and so that a secondary axis of magnetization (in particular, the hard axis HA) of the magnetoresistive elements 33, 34 extends perpendicular to the lines of flux of the magnetic field $B_2$ (i.e., the HA is parallel to the axis Y) generated by the conductive portions 32a, 32b when the second magnetic-field generator 32 is traversed by electric current. In this way, the magnetoresistive elements 33, 34 are subjected to a magnetization both along the easy axis EA (magnetic field $B_2$) and along the hard axis HA (magnetic field $B_1$).

The magnetic-field sensor 30 further comprises a third magnetoresistive element (or simply magnetoresistor) 35 and a fourth magnetoresistive element (or simply magnetoresistor) 36, each of which includes a barber-pole structure and each of which extending on top of, in top-plan view along the axis Z, the conductive portions 32a, 32b of the second magnetic-field generator 32 and the conductive portions 31a, 31b of the first magnetic-field generator 31.

In greater detail, the magnetoresistive elements 35, 36 are set on top of the first and second magnetic-field generators 31, 32 so that the preferred axis of magnetization (in particular, the easy axis EA) of each respective magnetoresistive element 35, 36 extends perpendicular to the lines of flux of the magnetic field $B_2$ (i.e., the EA is parallel to the axis Y) generated by the conductive portions 32a, 32b when the second magnetic-field generator 32 is traversed by electric current and so that a secondary axis of magnetization (in particular, the hard axis HA) of the magnetoresistive elements 35, 36 extends perpendicular to the lines of flux of the magnetic field $B_1$ (i.e., the HA is parallel to the axis X) generated by the conductive portions 31a, 31b when the first magnetic-field generator 31 is traversed by electric current. In this way, the magnetoresistive elements 35, 36 are subjected to a magnetization both along the easy axis EA (magnetic field $B_1$) and along the hard axis HA (magnetic field $B_2$).

The second magnetic-field generator 32 is configured for carrying out the operation of set/reset of the first and second magnetoresistive elements 33, 34 and/or the operation of calibration/offset compensation of the third and fourth magnetoresistive elements 35, 36. The second magnetic-field generator 32 can hence be operated indifferently with purposes of set/reset of the first and second magnetoresistive elements 33, 34 (as has been described with reference to the strap 20 of FIG. 1) or with purposes of calibration during testing or compensation of the offset of the third and fourth magnetoresistive elements 35, 36 (as has been described with reference to the strap 19 of FIG. 1), or simultaneously with both of the purposes of set/reset of the first and second magnetoresistive elements 33, 34 and calibration/offset compensation of the third and fourth magnetoresistive elements 35, 36.

Likewise, the first magnetic-field generator 31 is configured for carrying out both the operation of set/reset of the third and fourth magnetoresistive elements 35, 36 and the operation of calibration/offset compensation of the first and second magnetoresistive elements 33, 34. The first magnetic-field generator 31 can hence be operated indifferently with purposes of set/reset of the third and fourth magnetoresistive elements 35, 36 (as has been described with reference to the strap 20 of FIG. 1) or with purposes of calibration during testing or compensation of the offset of the first and second magnetoresistive elements 33, 34 (as has been described with reference to the strap 19 of FIG. 1), or simultaneously with both of the purposes of set/reset of the third and fourth magnetoresistive elements 35, 36 and calibration/offset compensation of the first and second magnetoresistive elements 33, 34.

Figure 10:
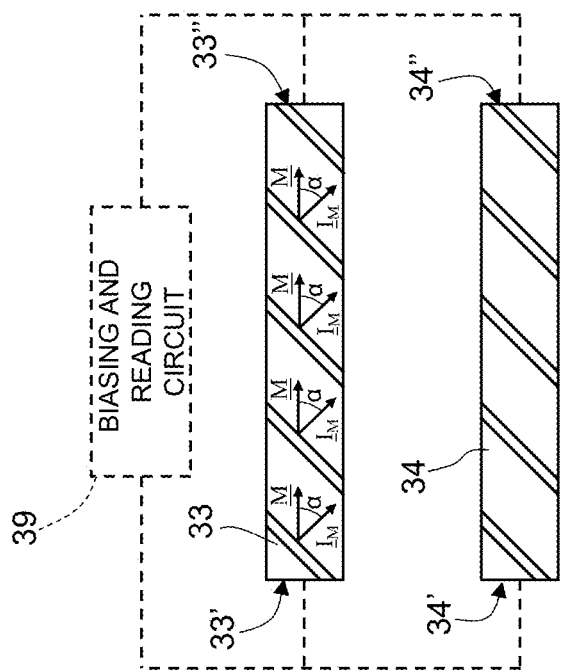
FIGS. 9 and 10 show magnetoresistive elements of the magnetic-field sensor of FIG. 2.
Figure 9:
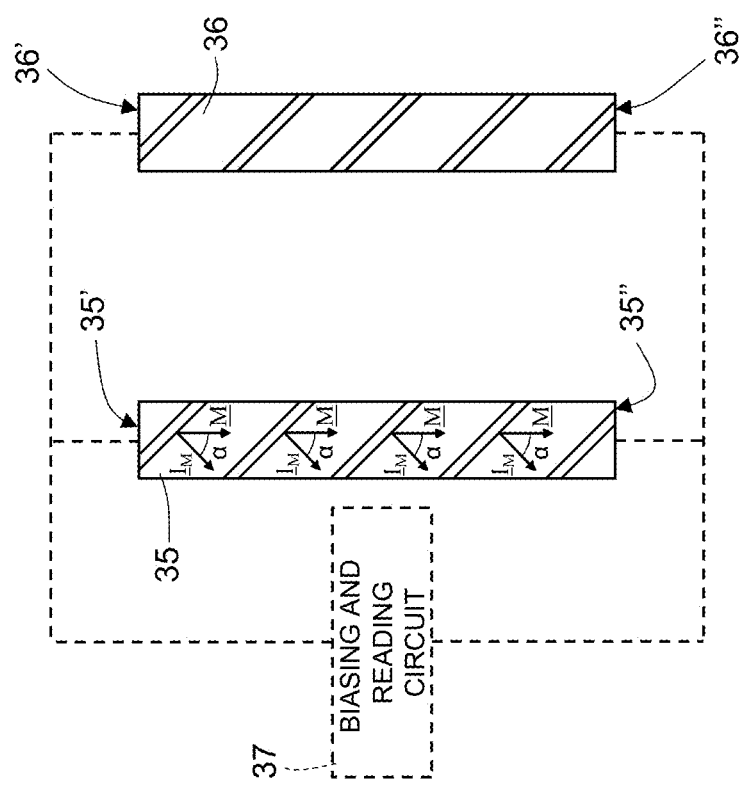

During use, the magnetoresistive elements 33-36 are biased in a known way, for example, as illustrated in FIGS. 9 and 10.

The embodiment illustrated in FIG. 2 is a non-limiting example of the present disclosure. In particular, it is possible to envisage just one magnetoresistive element 33 having the easy axis along X and just one magnetoresistive element 35 having the easy axis along Y (i.e., orthogonal to X). In this case, the magnetoresistive elements 34 and 36 are not present. Alternatively, it is possible to envisage use of eight magnetoresistive elements: four of them are connected together to form a Wheatstone bridge and are oriented so that their easy axis extends along X; the remaining four are connected together to form a further Wheatstone bridge and are oriented so that their easy axis extends along Y (i.e., orthogonal to X).

With reference to FIGS. 3-5, the second magnetic-field generator 32 comprises, as has been said, two conductive portions 32a, 32b, electrically connected by an electrical-connection portion 32c. The conductive portions 32a, 32b, illustrated in isolation in FIG. 4, are coplanar. In particular, the conductive portions 32a, 32b are made of metal material (for example, aluminum, copper, gold, etc.) and are formed on one and the same metal level. Even more in particular, also the electrical-connection portion 32c, illustrated in isolation in FIG. 5, is made of metal and is formed in a metal level different from the metal level of the conductive portions 32a, 32b and connected to them by metallic vias 39a, 39b.

For example, the conductive portions 32a, 32b of FIG. 4 are provided in a fourth metal level ML4 and the electrical-connection portion 32c of FIG. 5 is formed in a third metal level ML3 of the wafer 100.

With reference to FIG. 3, the conductive portion 32a comprises a first terminal 32' that can be connected to a respective terminal 35a of a current generator 35; the conductive portion 32b comprises a second terminal 32'' that can be connected to another terminal 35b of the current generator 35. In this way, in use, a current $i_p'$ is made to flow between the first terminal 32' and the second terminal 32'', or vice versa.

For the purposes of the present description, the current $i_p'$ corresponds to the set/reset current $i_{SR}$ when the second magnetic-field generator 32 is operated in order to carry out operations of set and reset of the magnetoresistive elements 33, 34 and to the calibration/offset-compensation current $i_{OFF}$ when the second magnetic-field generator 32 is operated in order to carry out operations of calibration/offset compensation of the magnetoresistive elements 35, 36.

Figure 6:
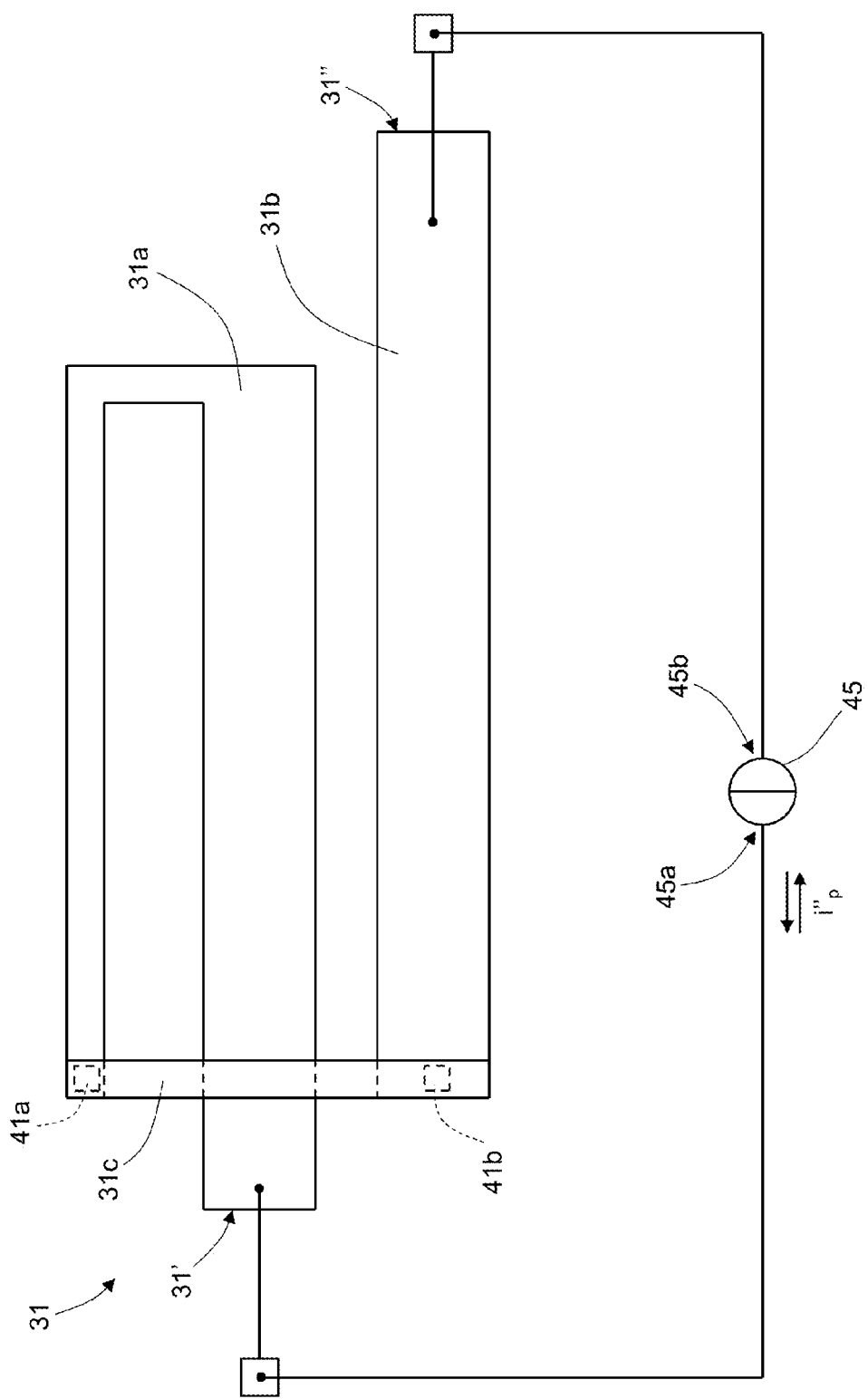
FIG. 6 shows, in schematic top-plan view, a further magnetic-field generator in the form of a conductive strip of the magnetic-field sensor of FIG. 2.

With reference to FIGS. 6-8, the first magnetic-field generator 31 comprises, as has been said, two conductive portions 31a, 31b (illustrated in isolation in FIG. 7), electrically connected by an electrical-connection portion 31c (illustrated in isolation in FIG. 8). The conductive portions 31a, 31b are coplanar. In particular, the conductive portions 31a, 31b are made of metal material (for example, aluminum, copper, gold, etc.) and are formed on one and the same metal level different from the metal level in which the conductive portions 32a, 32b of the second magnetic-field generator 32 are formed. Even more in particular, also the electrical-connection portion 31c is made of metal and is formed in a metal level different from the metal level of the conductive portions 31a, 31b and connected to them by metallic vias 41a, 41b.

According to one embodiment, the connection portions 31c and 32c of the first and second magnetic-field generators 31, 32, respectively, are formed on one and the same metal level. For example, the conductive portions 31a, 31b of FIG. 7 are provided in a second metal level ML2 and the electrical-connection portion 31c of FIG. 8 is formed in a third metal level ML3 of the wafer 100.

With reference to FIG. 6, the conductive portion 31a comprises a first terminal 31' that can be connected to a respective terminal 45a of a current generator 45; the conductive portion 31b comprises a second terminal 31'' that can be connected to another terminal 45b of the current generator 45. In this way, in use, a current $i_p''$ is made to flow between the first terminal 31' and the second terminal 31'', or vice versa.

For the purposes of the present description, the current $i_p''$ corresponds to the set/reset current $i_{SR}$ when the first magnetic-field generator 31 is operated in order to carry out operations of set and reset of the magnetoresistive elements 35, 36 and to the calibration/offset-compensation current $I_{OFF}$ when the first magnetic-field generator 31 is operated in order to carry out operations of calibration/offset compensation of the magnetoresistive elements 33, 34.

As may be noted from FIG. 3, in the conductive portions 32a, 32b the current $i_p'$ flows in one and the same first direction (direction parallel to the axis Y) and with one and the same sense; likewise, as may be noted from FIG. 6, in the conductive portions 31a, 31b, the current $i_p''$ flows in one and the same second direction (direction parallel to the axis X) and with one and the same sense. The aforementioned first and second directions of flow of the currents $i_p'$, $i_p''$ are substantially orthogonal to one another. In this way, when in use both the first and the second magnetic-field generators 31, 32 are traversed by a respective current $i_p''$ and $i_p'$, all the magnetoresistive elements 33-36 are subjected to both of the magnetic fields $B_1$ and $B_2$. By appropriately selecting the value of current that flows in the first and second magnetic-field generators 31, 32 it is hence possible to execute selectively the set/reset and offset-compensation operations only on the first and second magnetoresistive elements 33, 34 or, alternatively, only on the third and fourth magnetoresistive elements 35, 36.

For the purposes of the present description, the currents $i_p'$, $i_p''$ correspond to:

(i) the set/reset current $i_{SR}$ when the respective magnetic-field generator 31, 32 is operated in order to carry out operations for set and/or reset of the magnetoresistive elements 35, 36 or, respectively, of the magnetoresistive elements 33, 34;

(ii) the calibration/offset-compensation current $I_{OFF}$ when the respective magnetic-field generator 31, 32 is operated in order to carry out operations of calibration/offset compensation of the magnetoresistive elements 35, 36 or, respectively, of the magnetoresistive elements 33, 34. The difference in the two cases lies in the value of the amplitude of the driven current: low for calibration; high for set/reset.

The magnetoresistive elements 33-36 of the magnetic-field sensor 30 have, according to one embodiment of the present disclosure, a structure of the barber-pole type and are schematically illustrated, in isolation, in FIGS. 9 and 10. In particular, FIG. 9 shows the third and fourth magnetoresistive elements 35, 36 and FIG. 10 shows the first and second magnetoresistive elements 33, 34.

Each magnetoresistive element 33-36 is typically formed as a single strip of ferromagnetic material (for example, deposited thin film comprising an Ni/Fe alloy), in particular in barber-pole configuration. Alternatively, the barber-pole structure can be omitted.

The magnetoresistive elements 33-36 are arranged in metal levels of the wafer 100 in such a way as to be electrically insulated from the first and second magnetic-field generators 31, 32 and at least partially aligned, along the axis Z, to the first and second magnetic-field generators 31, 32 and in any case in such a way as to interact with the magnetic fields $B_1$ and $B_2$ generated by the portions 31a, 31b and, respectively, 32a, 32b, of the magnetic-field generators 31, 32 when traversed by the respective currents $i_p''$, $i_p'$.

The third and fourth magnetoresistive elements 35, 36 of FIG. 9 are each formed by a strip made of magnetoresistive material (e.g., an NiFe alloy) and by elements with high electrical conductivity that form the barber-pole structure. The strips of magnetoresistive material extend between a substrate of the wafer 100 and a first metal level, whilst the elements with high electrical conductivity that form the barber-pole structure extend into the first metal level, in direct electrical contact with the respective magnetoresistive strips.

The first and second magnetoresistive elements 33, 34 of FIG. 10 are formed as is described with reference to FIG. 9. Each magnetoresistive element 33, 34 is formed by a strip of magnetoresistive material (e.g., an NiFe alloy) and by elements with high electrical conductivity that form the barber-pole structure. The strips of magnetoresistive material extend between the second and third metal levels of the wafer 100 and the elements with high electrical conductivity that form the barber-pole structure extend into the third metal level, in direct electrical contact with the respective magnetoresistive strips.

With reference to both FIG. 9 and FIG. 10, it is to be noted that each magnetoresistive element 33-36 is in itself known and comprises a portion of magnetoresistive material (for example, an alloy of nickel and iron, more in particular, permalloy) in ohmic contact with the barber-pole structure, including conductive elements with high electrical conductivity (for example, metal, such as aluminum, silver, gold, etc.). The conductive elements of the barber-pole structure are inclined by a certain angle $\alpha$ (typically, $\alpha=45°$) with respect to the axis of spontaneous magnetization of the magnetoresistive element (indicated in the figures by the vector M). Each magnetoresistive element 33-36 possesses terminal portions 33'-36' and 33"-36" that can be connected to a respective biasing and reading circuit 37, 39 of a known type (illustrated by a dashed line in FIG. 9 and FIG. 10). The biasing and reading circuits 37, 39 are configured for generating a flow of current $I_M$ between the terminals 33'-36' and 33"-36" of the respective magnetoresistive elements and reading the value of resistance of the magnetoresistive elements to the passage of the current $I_M$.

As a result of the barber-pole structure, the vector $\underline{I}_M$ that represents the current $I_M$ is oriented in such a way as to present an angle $\alpha$ with the magnetization vector $\underline{M}$ of each magnetoresistive element, in a situation of zero field along the hard axis (i.e., $\underline{M}$ oriented along the easy axis).

A possible external magnetic field, having a field component perpendicular to the easy axis EA (i.e., parallel to the hard axis HA), applied at least to one magnetoresistive element, causes a rotation of the magnetization vector M and a consequent variation of the value of the angle $\alpha$. This consequently causes a variation of the electrical resistance of the magnetoresistive element (also referred to as "magnetoresistive effect") and can be detected by the biasing and reading circuit by acquiring and analyzing an output signal taken across the terminal portions 33'-36' and 33"-36".

Figure 11:
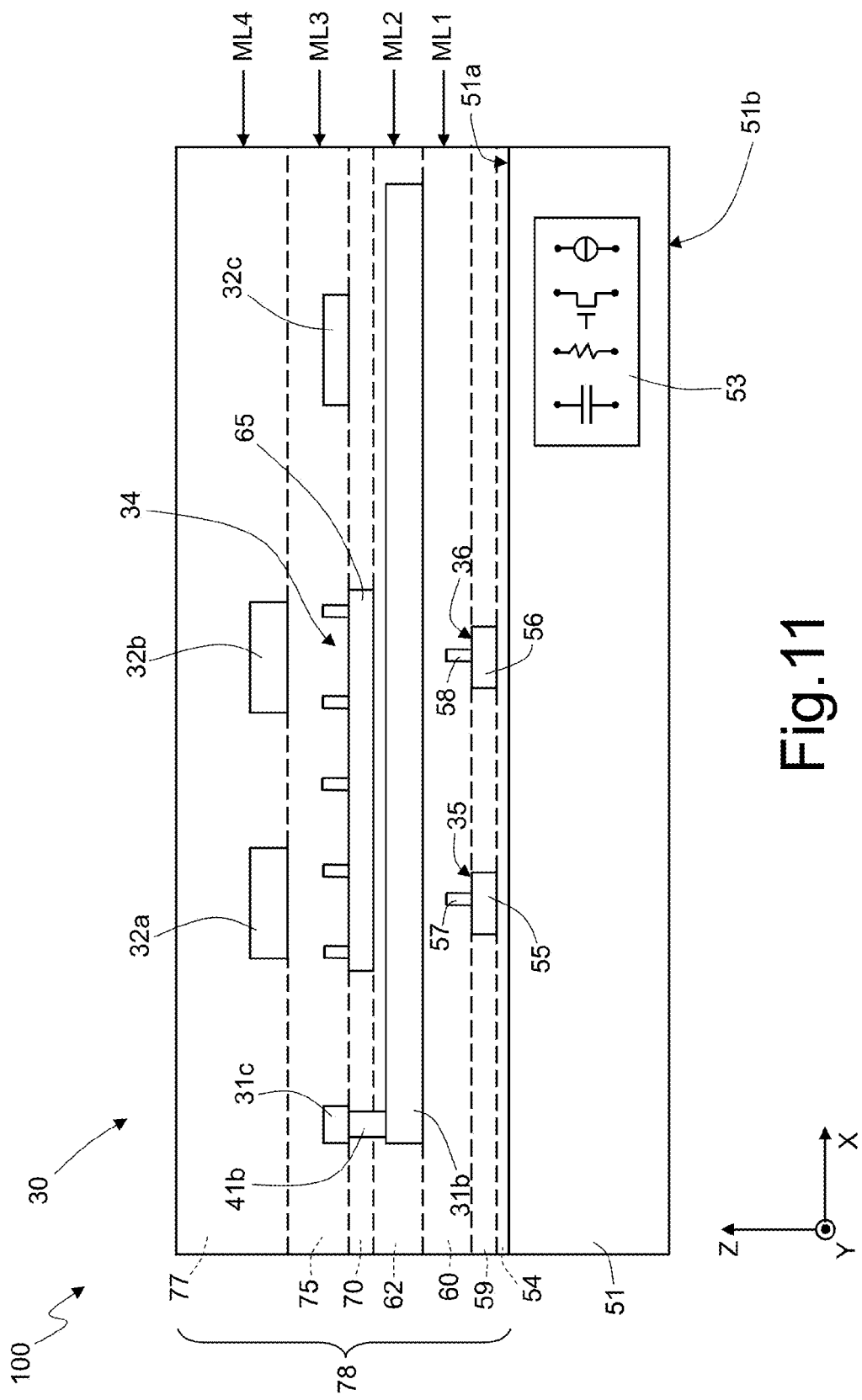
FIG. 11 shows, in cross-sectional view, the magnetic-field sensor of FIG. 2, along the line of cross section XI-XI.

FIG. 11 shows a cross-sectional view of the magnetic-field sensor 30, according to one embodiment of the present disclosure. The cross section of FIG. 11 is taken along the line of cross section XI-XI of FIG. 2.

FIG. 11 is now described in regard to manufacturing steps according to FIGS. 12a-12d for forming the magnetic-field sensor 30 having the structure illustrated in FIG. 11.

Initially (FIG. 12a), the wafer 100 comprises a substrate 51, for example, of semiconductor material such as silicon, having a bottom surface 51b and a top surface 51a. The substrate 51 can be of a previously machined type, for example, can comprise electronic components 53 formed within an active area and/or electrical-contact pads (not illustrated); then, after deposition of a dielectric (electrically insulating) layer 54 on the top surface 51a of the substrate 51, the third and fourth magnetoresistive elements 35, 36 are provided by deposition (in a way in itself known) of a layer of magnetoresistive material (for example, an NiFe alloy) on top of the dielectric layer 54 and subsequent etching of said magnetoresistive layer to form magnetoresistive strips 55, 56 having desired shapes and dimensions. This is followed by the deposition of a dielectric layer 59, which is reduced in thickness until the magnetoresistive strips 55, 56 are exposed. Formed on top of the exposed magnetoresistive strips 55, 56 and in electrical contact with them, is a conductive layer, for example, made of metal. A subsequent step of selective etching of the conductive layer thus deposited enables a structure of the barber-pole type 57, 58, described previously, to be obtained. The magnetoresistive strips 55, 56 and the respective barber-pole structure 57, 58 form the third magnetoresistive element 35 and, respectively, the fourth magnetoresistive element 36.

The level in which the barber-pole structures 57, 58 are formed is the first metal level ML1 of the wafer 100.

Then (FIG. 11b), deposited on the third and fourth magnetoresistive elements 35, 36 is a dielectric layer 60, having a thickness comprised between approximately 0.5 μm and 3 μm. Following upon deposition, the dielectric layer 60 is planarized (e.g., by CMP).

This is followed by a step of deposition of a conductive layer, for example, metal and with a subsequent step of definition of said conductive layer to form the conductive portions 31a, 31b of the first magnetic-field generator 31. In top-plan view, the conductive portions 31a, 31b thus defined have shapes and relative arrangement of the type illustrated in FIG. 6.

In greater detail, the conductive portion 31a is a substantially U-shaped conductive strip and comprises (see FIG. 6) a region 31a' with main extension along the axis X partially overlapping the third and fourth magnetoresistive elements 35, 36, as already illustrated in FIG. 1 and a curved region 31a" that functions as electrical-connection portion with the conductive portion 31c.

The region 31a' extends along the axis X for a length comprised between approximately 50 μm and 1 mm and along the axis Y for a length comprised between approximately 10 μm and 200 μm. The region 31a", having just the function of electrical connection, has dimensions chosen according to the need, such as to sustain the current $i_p$" during use.

The thickness, measured along the axis Z, of the conductive portion 31a is comprised between 1 μm and 5 μm.

The conductive portion 31b is a conductive strip having a main direction of extension along the axis X (for example, comprised between 50 μm and 1 mm) and a secondary direction of extension along the axis Y (for example, comprised between 10 μm and 200 μm). The thickness along the axis Z of the conductive portion 31b is comprised between 1 μm and 5 μm.

Furthermore, the conductive portion 31b extends in such a way as to overlap, or be set in the proximity of, the third and fourth magnetoresistive elements 35, 36, as already illustrated in FIG. 2.

The level in which the conductive portions 31a, 31b are formed is the second metal level ML2 of the wafer 100.

Then, once again with reference to FIG. 11b, deposited on the wafer 100 and in particular on the conductive portions 31a and 31b, is a dielectric layer 62, having a thickness comprised between 0.5 μm and 3 μm. The dielectric layer 62 is then planarized.

Next, provided on top of the dielectric layer 62 are the first and second magnetoresistive elements 33, 34 by deposition (in a way in itself known) of a layer of magnetoresistive material (for example, an NiFe alloy); then, the magnetoresistive layer thus deposited is etched to form magnetoresistive strips 65, 66 having desired shapes and dimensions. The cross section of FIG. 12b shows just the magnetoresistive strip 65, designed to form, following upon subsequent manufacturing steps, the second magnetoresistive element 34.

Then (FIG. 12c), a deposition of a dielectric layer 70 is carried out on the wafer 100. The dielectric layer 70 is then reduced in thickness until the magnetoresistive strip 65 is exposed. The dielectric layers 62 and 70 are selectively etched so as to form through openings (only one through opening is visible in FIG. 12c) in regions of the dielectric layers 62 and 70 aligned, along the axis Z, to respective regions of the conductive portions 31a and 31b.

The through openings are then filled with conductive material so as to provide the conductive through vias 41a and 41b described with reference to FIG. 2.

Next, a layer of conductive material, in particular metal, is deposited on the wafer 100. This layer of conductive material is selectively etched so as to form the electrical-connection portion 31c (illustrated, for example, in FIGS. 5 and 7), the electrical-connection portion 32c (illustrated, for example, in FIGS. 2 and 4) and the barber-pole structures 73 of the first and second magnetoresistive elements 33, 34. The level in which the electrical-connection portions 31c, 32c and the barber-pole structures of the first and second magnetoresistive elements 33, 34 are formed is the third metal level ML3 of the wafer 100.

In this way, the conductive portion 31b is in electrical connection with the conductive portion 31a by the conductive through vias 41a, 41b formed through the dielectric layers 62 and 70.

Next (FIG. 12d), a dielectric layer 75 is formed on the wafer 100 and planarized. The dielectric layer 75 is selectively etched so as to form therein the conductive through vias 39a, 39b (not visible in the cross section of FIG. 12d). A metal level is deposited on the dielectric layer 75. The latter is etched so as to define the conductive portions 32a, 32b (illustrated in top-plan view, for example, in FIGS. 2 and 3). The conductive portions 32a, 32b are formed so that a region of them is in electrical contact with a respective conductive through via 39a, 39b. In this way, the conductive portion 32a is in electrical connection with the conductive portion 32b by the conductive through vias 39a, 39b formed through the dielectric layer 75.

The level in which the conductive portions 32a, 32b are formed is the fourth metal level ML4 of the wafer 100.

A deposition of a further dielectric layer 77 on top of the conductive portions 32a, 32b enables insulation of the latter from the external environment. In this way, the magnetic-field sensor 30 of FIG. 11 is obtained.

The dielectric layers 54, 59, 60, 62, 70, 75, 77 form, at the end of the process steps described, a dielectric or insulating layer 78, for example, made of silicon oxide $SiO_2$.

The magnetoresistive strips 55, 56 are grown in a known way, so that the easy axis EA extends along the axis Y; the magnetoresistive strips of the magnetoresistive elements 33, 34 (only the magnetoresistive strip 65 is illustrated in FIG. 10) are also grown in a known way so that their respective easy axis EA extends along the axis X.

Figure 13:
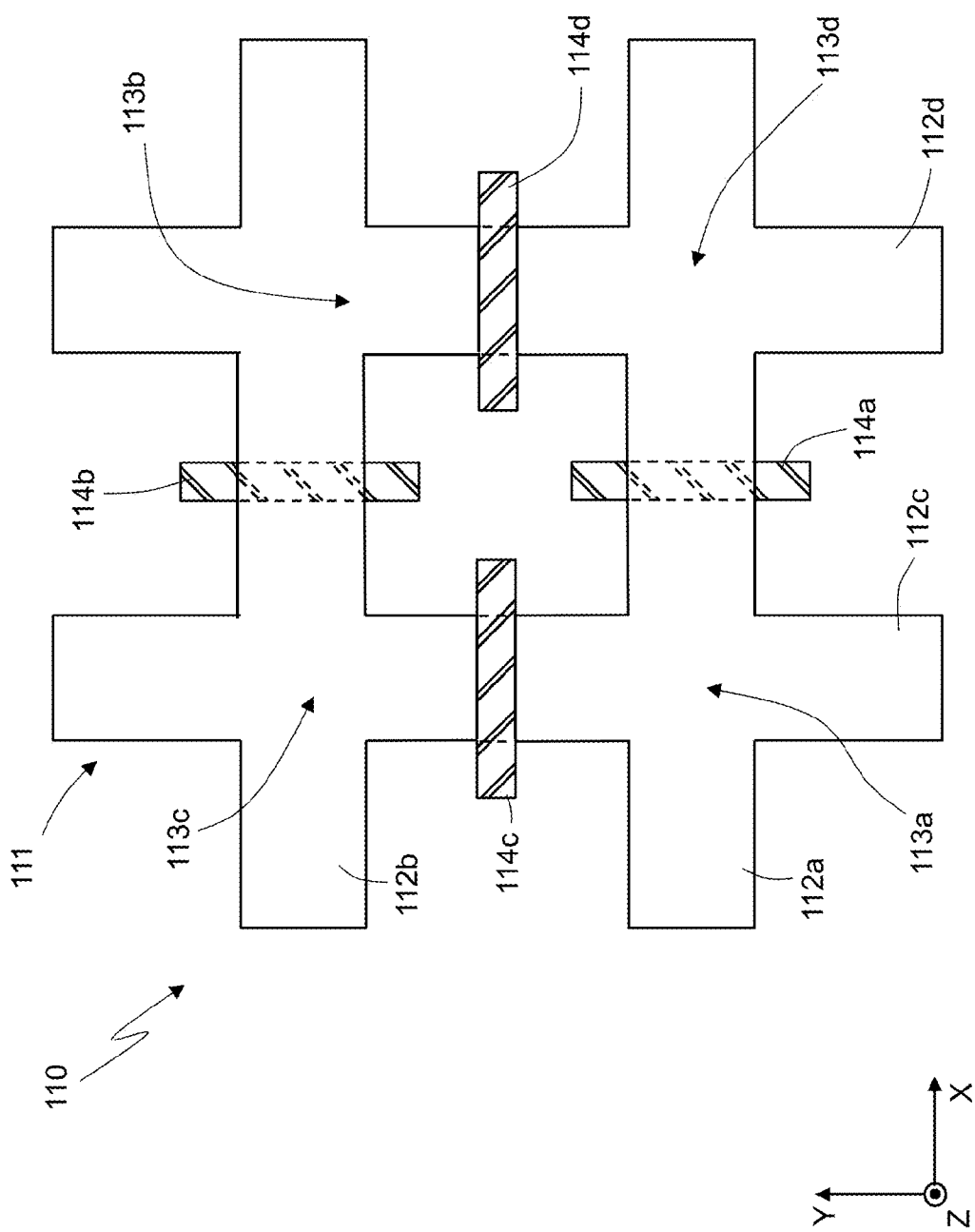
FIG. 13 shows, in schematic top-plan view, a magnetic-field sensor according to a further embodiment of the present disclosure.

FIG. 13 shows a further embodiment of a magnetic-field sensor 110 according to the present disclosure.

According to the embodiment of FIG. 13, the magnetic-field generator 110 is formed by a plurality of conductive strips, which are, for example, made of metal, are coplanar and are formed in the same metal level. The conductive strips extend in directions X and Y orthogonal to one another and intersect in points of intersection 113a-113d, to form a grid 111.

The operations of set/reset of the magnetoresistive elements of the magnetic-field sensor 110 are executed by appropriately biasing the grid 111.

The magnetic-field sensor 110 comprises, in particular, four conductive strips 112a-112d, arranged to form the grid 111. The conductive strips 112a, 112b extend in a main direction of extension parallel to the axis X, whereas the conductive strips 112c, 112d extend in a main direction of extension parallel to the axis Y.

Magnetoresistive elements 114a-114d are set overlapping the conductive strips 112a-112d. In particular, the magnetoresistive elements 114a and 114b are arranged aligned, along the axis Z, to the conductive strips 112a and 112b respectively and are oriented so that their easy axis EA is orthogonal to the main direction of extension of the respective conductive strip 112a, 112b (i.e., orthogonal to the axis X) and so that their hard axis HA is orthogonal to the main direction of extension of the conductive strips 112c, 112d (i.e., orthogonal to the axis Y).

The magnetoresistive elements 114c and 114d are arranged aligned, along the axis Z, to the conductive strips 112c and 112d, respectively and are oriented so that their easy axis EA is orthogonal to the main direction of extension of the respective conductive strips 112c, 112d and so that their hard axis HA is orthogonal to the main direction of extension of the conductive strips 112a, 112b.

With reference to FIG. 14a, in use, for the operations of set/reset of the magnetoresistive elements 114a, 114b, a current $i_{SR}$ flows in the conductive strips 112a and 112b in the direction defined by the axis X (with opposite senses for the set and reset operations), generating a magnetic field $B_{SR}$ having field components along the axis Y, i.e., parallel to the easy axis EA of the magnetoresistive elements 114a, 114b.

Figure 14B:
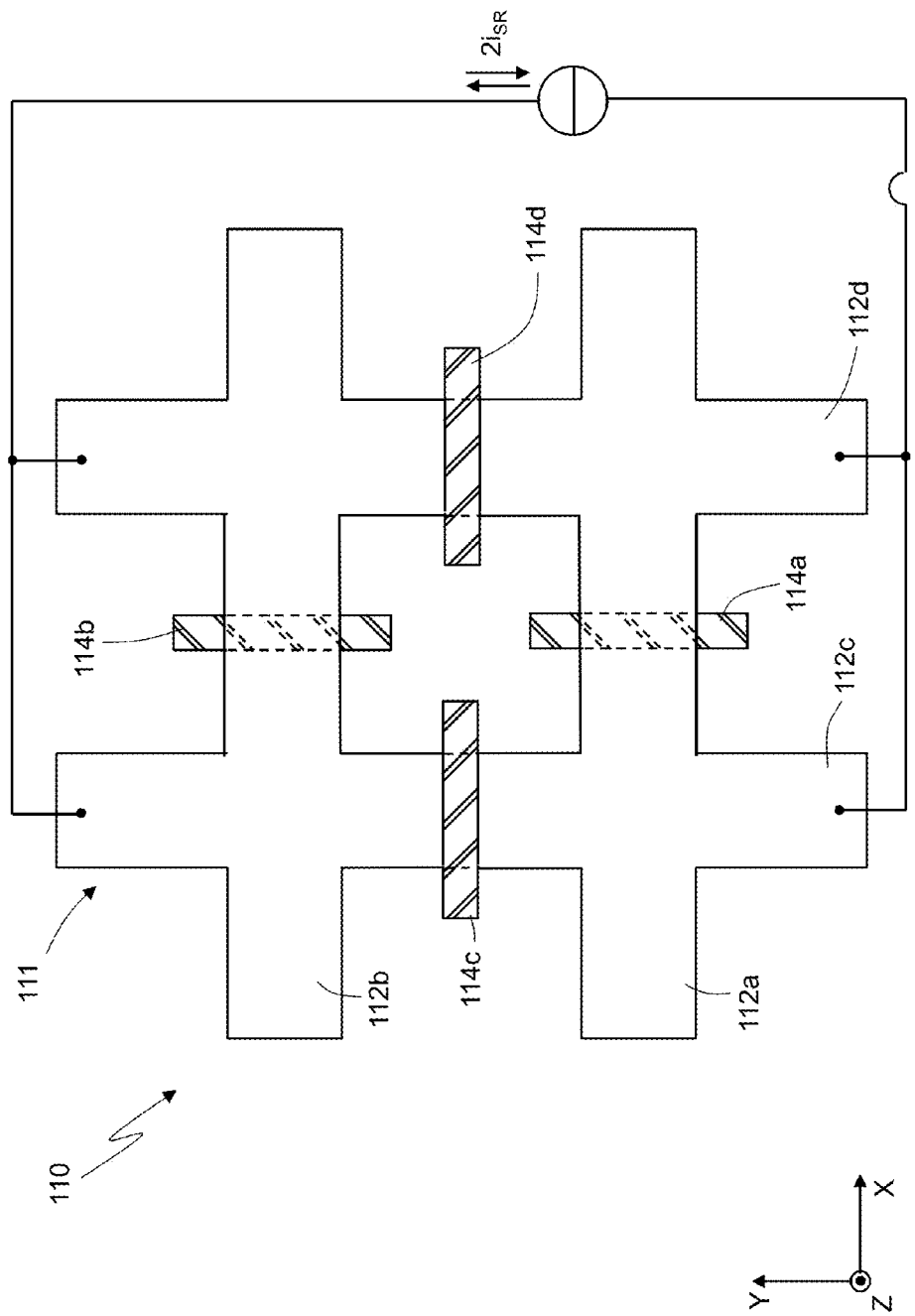

With reference to FIG. 14b, during the operations of set/reset of the magnetoresistive elements 114c, 114d, a current $i_{SR}$ flows in the conductive strips 112c and 112d in the direction defined by the axis Y (with opposite senses for the set and reset operations), generating a magnetic field $B_{SR}$ having field components along the axis X, i.e., parallel to the easy axis EA of the magnetoresistive elements 114c, 114d.

During the operations of set/reset only the conductive strips designed for executing the respective operations are biased. The remaining conductive strips are maintained at high impedance.

According to a further embodiment of the present disclosure, it is possible to execute simultaneously the operations of set/reset and calibration/offset compensation of the magnetoresistive elements of the magnetic-field sensor 110 by setting the magnetoresistive elements 114a-114d at the points of intersection 113a-113d. In particular, the magnetoresistive element 114a is set at the point of intersection 113a; the magnetoresistive element 114b is set at the point of intersection 113b; the magnetoresistive element 114c is set at the point of intersection 113c; the magnetoresistive element 114d is set at the point of intersection 113d.

In this way, each magnetoresistive element 114a-114d is subject both to a magnetic field parallel to its own easy axis (for the set/reset operations) and to a magnetic field parallel to its own hard axis (for the compensation/calibration operations).

For the operations of calibration/offset compensation of the magnetoresistive elements 114a, 114b, a current $i_{OFF}$ flows in the conductive strips 112c, 112d in the direction defined by the axis Y, generating a respective magnetic field $B_{OFF}$ having components along the axis X, i.e., parallel to the hard axis HA of the magnetoresistive elements 114a, 114b. For the operations of calibration/offset compensation of the magnetoresistive elements 114c, 114d, a current $i_{OFF}$ flows in the conductive strips 112a, 112b in the direction defined by the axis X, generating a respective magnetic field $B_{OFF}$ having components along the axis Y, i.e., parallel to the hard axis HA of the magnetoresistive elements 114c, 114d.

Biasing of the conductive strips for the set and reset operations occurs with a current $i_{SR}$ typically comprised between 200 mA and 1 A; the operations of calibration are typically made by generating a current $i_{OFF}$ typically comprised between 5 mA and 50 mA. However, on the basis of the type of the magnetoresistive elements used, said values can be different, higher or lower than the ranges indicated.

It is evident that the operations of biasing and reading of the magnetoresistive elements 114a-114d are executed in a known way (for example, as represented schematically in FIGS. 9 and 10, or else inserting them in a Wheatstone bridge) and not described herein in so far as they do not form the subject of the present disclosure.

Figure 15B:
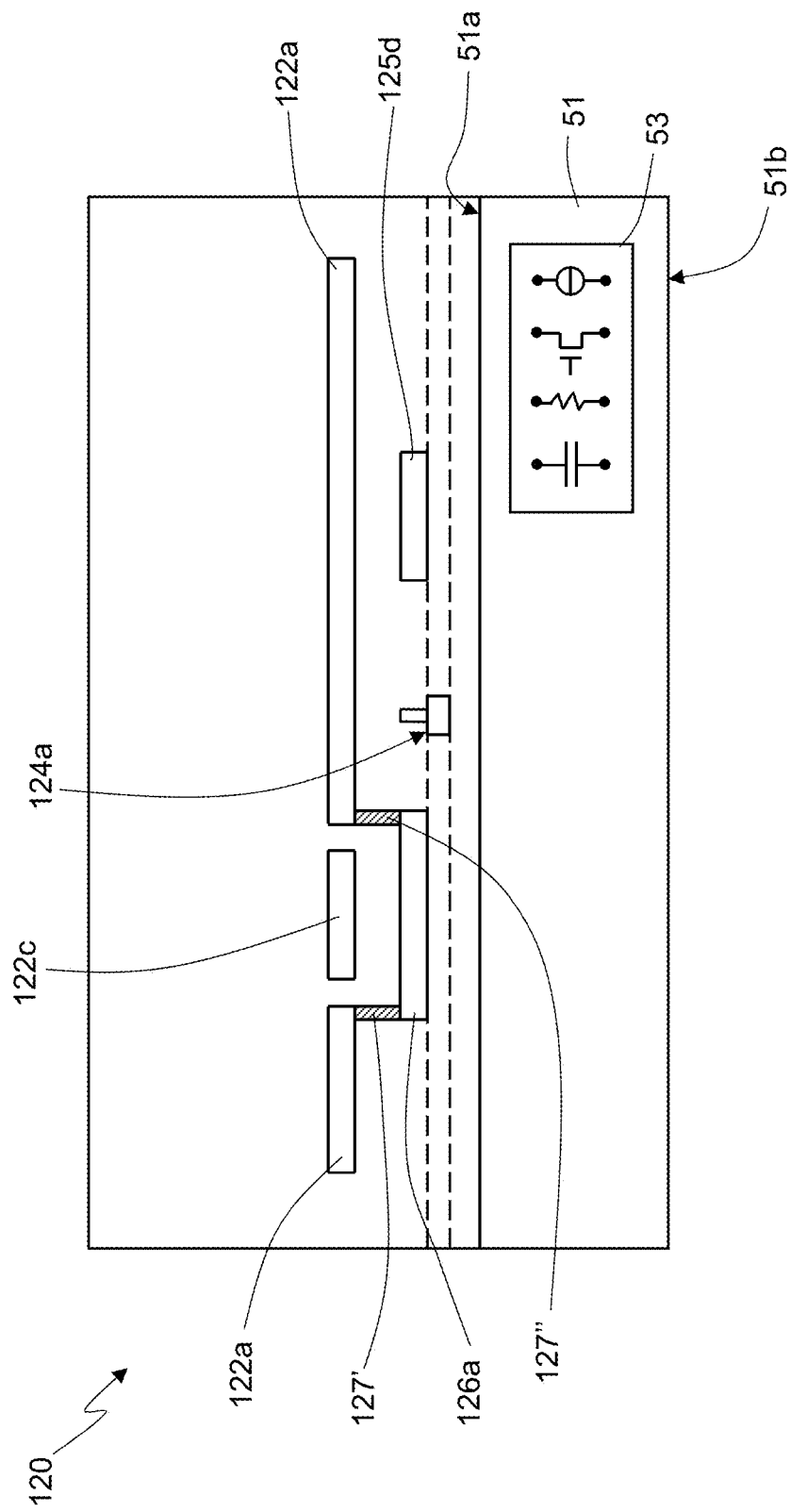
FIG. 15b shows, in cross-sectional view, the magnetic-field sensor of FIG. 15a along the line of cross section XV-XV.

FIGS. 15a and 15b show a magnetic-field sensor 120 according to a further embodiment of the present disclosure. FIG. 15b is a cross-sectional view of FIG. 15a, along the line of cross section XVXV of FIG. 15a.

The magnetic-field sensor 120 is similar to the magnetic-field sensor 110 of FIG. 13 in so far as it comprises four conductive strips 122a-122d, arranged to form, in top-plan view, a grid 121. The conductive strips 122a, 122b extend in a main direction of extension parallel to the axis Y, whilst the conductive strips 122c, 122d extend in a main direction of extension parallel to the axis X. Magnetoresistive elements 124a-124d, as has been described with reference to FIG. 13, are set overlapping the conductive strips 122a-122d.

With reference to FIG. 15b, the magnetic-field sensor 120 comprises the substrate 51 and a dielectric layer 123, which extends on the top surface 51a of the substrate 51. The dielectric layer 123 is similar to the dielectric layer 78 described previously.

The magnetoresistive elements 124a, 124b are coplanar with respect to one another and extend into the insulating layer at a first distance from the top surface 51a; likewise, the magnetoresistive elements 124c, 124d are coplanar with respect to one another and extend into the dielectric layer 123 at a second distance from the top surface 51a. The first and second distances are different from one another and in particular, the first distance is less than the second distance.

Unlike the magnetic-field sensor 110, the conductive strips 122a-122d of the magnetic-field sensor 120 are not electrically coupled to one another. More in particular, the conductive strips 122a and 122b are formed by: (i) portions of conductive strip coplanar with respect to one another and extending on one and the same metal level; and (ii) connection portions designed to couple electrically to one another the portions of conductive strip belonging to one and the same conductive strip 122a, 122b and extending in a metal level different from the metal level in which the portions of conductive strip belonging to one and the same conductive strip 122a, 122b extend.

Likewise, the conductive strips 122c and 122d are formed by: (i) portions of conductive strip coplanar with respect to one another and extending on one and the same metal level different from the metal level in which the portions of conductive strip belonging to the conductive strips 122a, 122b extend; and (ii) connection portions designed to couple electrically to one another the portions of conductive strip belonging to one and the same conductive strip 122c, 122d and extending in a metal level different from the metal level in which the portions of conductive strip belonging to one and the same conductive strip 122c, 122d extend. For this purpose, the conductive strips 122a and 122b include a respective underpass region 125a, 125b at points of intersection with the conductive strips 122c and 122d. Likewise, the conductive strips 122c and 122d include a respective underpass region 125c, 125d at further points of intersection with the conductive strips 122a and 122b. Each underpass 125a-125d comprises a conductive underpass portion 126a-126d and two through vias 127', 127" made of conductive material, configured for electrically coupling each conductive underpass portion 126a-126d with a respective portion of conductive strip 122a-122d, which extends into the top metal level so as to form the conductive strips 122a-122d.

Figure 16:
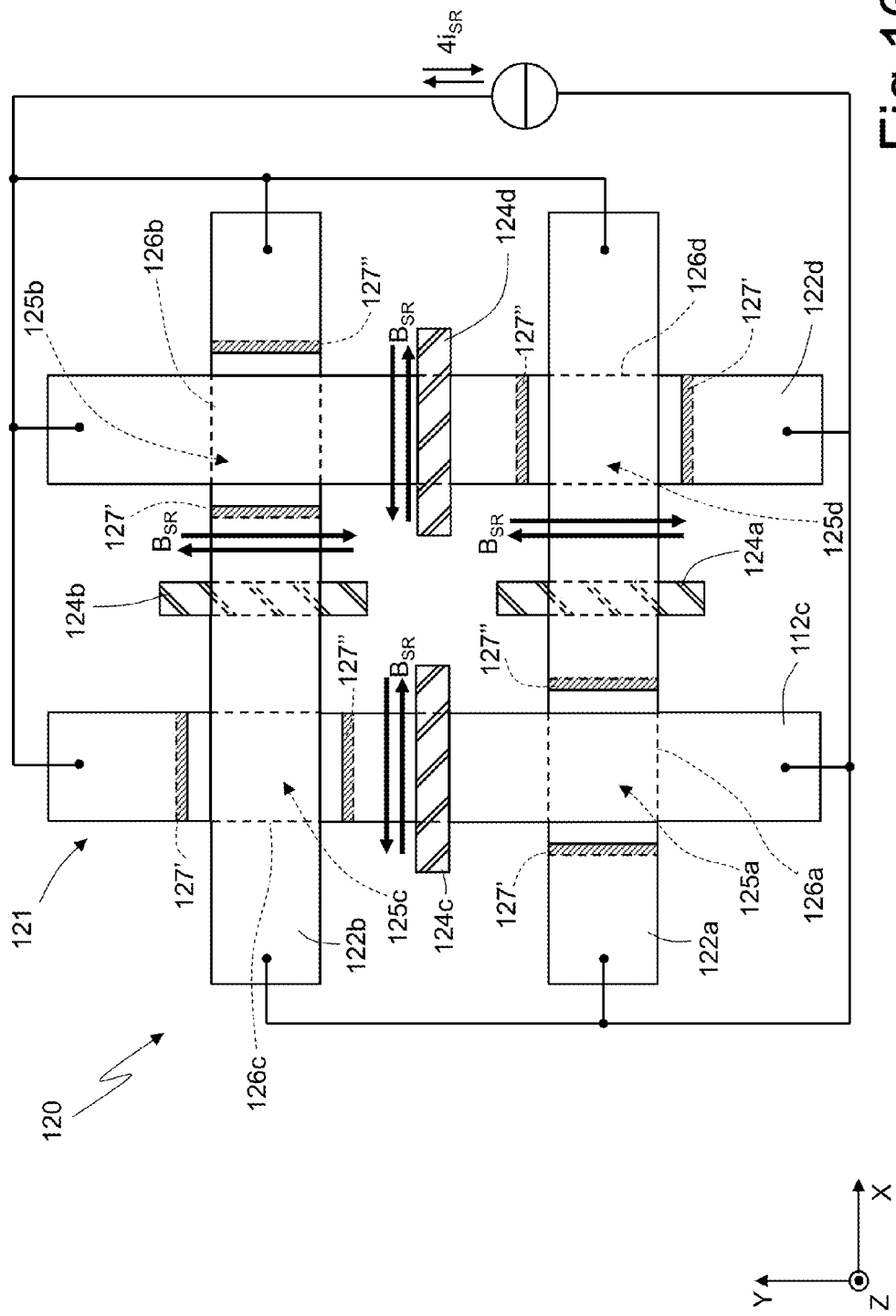
FIG. 16 shows the sensor of FIG. 15a during use for the set/reset operation.

The embodiment of FIGS. 15a, 15b affords the advantage that the operations of set/reset of the magnetoresistive elements 124a-124d can be executed simultaneously for all the magnetoresistive elements 124a-124d (see FIG. 16).

It is evident that, during use, the magnetoresistive elements 124a-124d are coupled to a biasing and reading circuit, for example as illustrated by way of example in FIGS. 9 and 10.

According to a different embodiment, there may be envisaged a further four magnetoresistive elements, connected together and to the magnetoresistive elements 124a-124d to form, in way in itself known, two respective Wheatstone bridges (one for each sensing axis).

With reference to FIG. 16, in use, for the operations of set/reset of the magnetoresistive elements 124a, 124b, a current $i_{SR}$ flows in the conductive strips 122a and 122b in the direction defined by the axis X (with opposite senses for the set and reset operations), generating a magnetic field $B_{SR}$ having field components along the axis Y, i.e., parallel to the easy axis EA of the magnetoresistive elements 124a, 124b.

To execute the operations of set/reset of the magnetoresistive elements 124c, 124d, the same current $i_{SR}$ flows in the conductive strips 122c and 122d in the direction defined by the axis Y (with opposite senses for the set and reset operations), generating a magnetic field $B_{SR}$ having field components along the axis X, i.e., parallel to the easy axis EA of the magnetoresistive elements 124c, 124d.

It is evident that, in order guarantee one and the same current $i_{SR}$ in all the conductive strips 122a-122d each underpass 125a-125d must be comparable, as regards the conductive characteristics, to the other underpasses 125a-125d. Current micromachining technologies, which guarantee high repeatability of the manufacturing processes, enable this requirement to be met. In particular, the underpasses 125a-125d are manufactured so as to present a low value of resistance of the through vias and low sheet resistance.

Figure 17A:
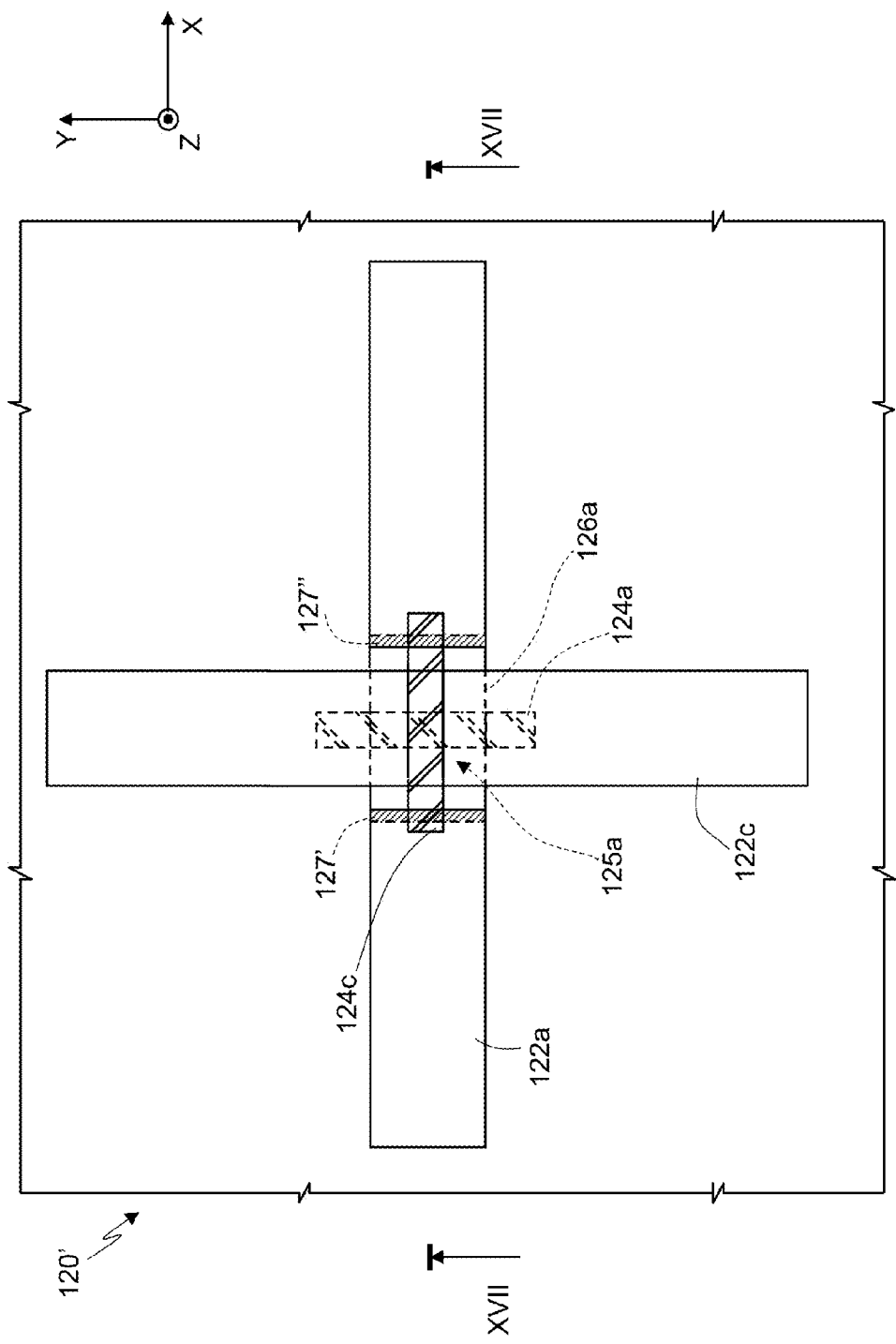
FIGS. 17a and 17b show, in top-plan view and in cross-sectional view, respectively, a magnetic-field sensor according to a further embodiment of the present disclosure.
Figure 17B:
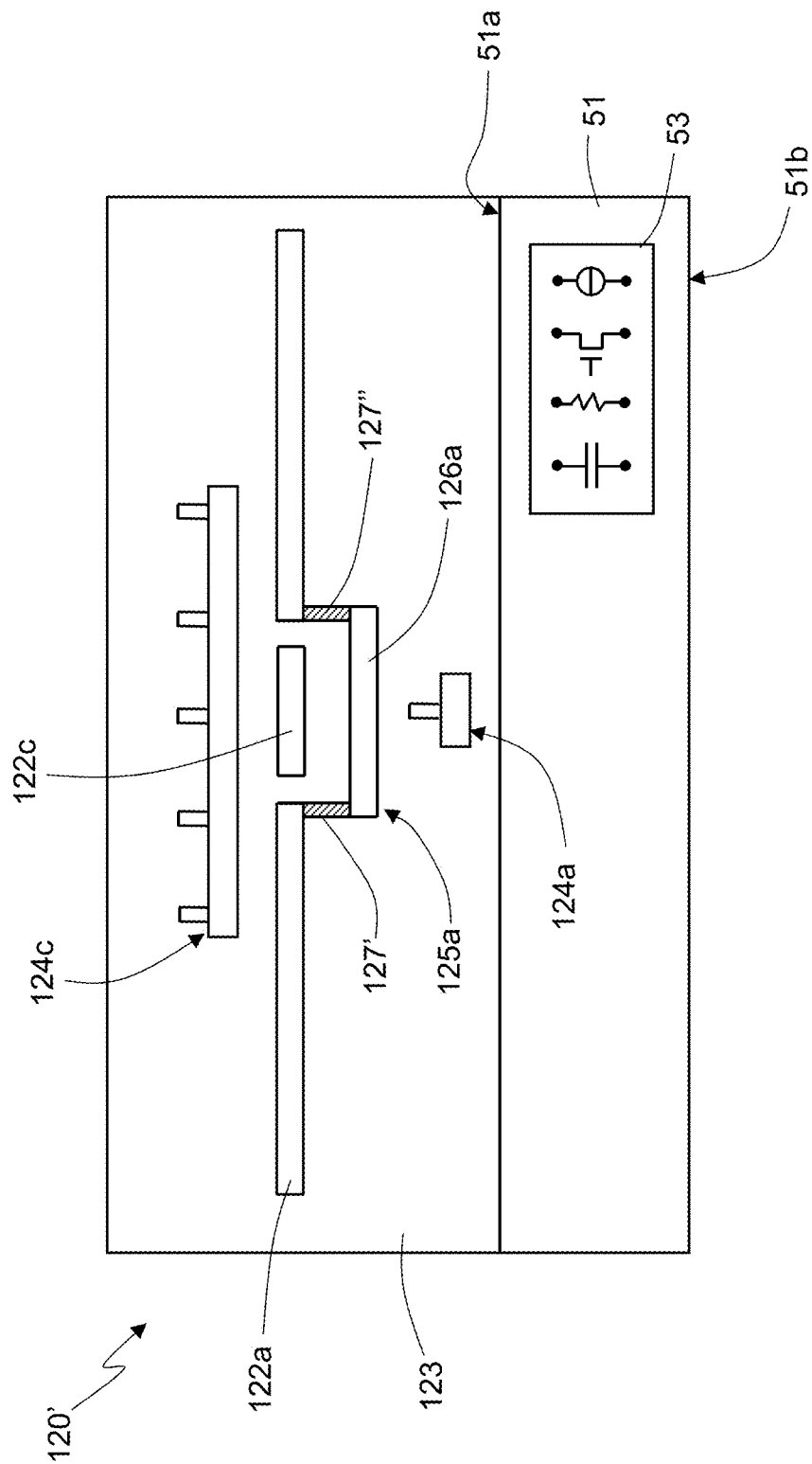

FIGS. 17a and 17b show in top-plan view and in cross-sectional view (along the line of cross section XVII-XVII of FIG. 17a) respectively, a magnetic-field sensor 120' according to a further embodiment of the present disclosure. The magnetic-field sensor 120' is similar to the magnetic-field sensor 120 of FIG. 15a, but comprises just the conductive strips 122a and 122c. In this case, only the conductive strip 122a is provided with the underpass 125a. The magnetoresistive elements 124a and 124c can be arranged on top of the respective conductive strip 122a, 122c, as illustrated in FIG. 15a, or else be vertically aligned (along Z) with respect to one another and to both of the conductive strips 122a, 122c, as illustrated in FIG. 17b. In other words, the magnetoresistive elements 124c and 124a extend substantially aligned, along Z, to the underpass 125a, at a respective first distance and second distance from the top surface 51a of the substrate 51.

The first and second distances are different from one another and in particular, the first distance is less than the second distance. It is evident that, during use, the magnetoresistive elements 124a and 124c are coupled to a biasing and reading circuit, for example as illustrated by way of example in FIGS. 9 and 10.

According to a further embodiment of the present disclosure, illustrated in FIGS. 18a (top view) and 18b (cross-sectional view along the line of cross section XVIII-XVIII of FIG. 18a), a magnetic-field sensor 150 comprises a concentrator 151. The concentrator 151 is, for example, of the type described in the document No. 2010A001050. The magnetic-field sensor 150 is a sensor of the type described according to any one of the embodiments of the present disclosure, for example the sensor 120 of FIGS. 15a and 15b.

To enable independent reading (detection) of magnetic fields acting along the axis Z, the magnetic-field sensor 150 comprises further magnetoresistive elements 152-155, arranged laterally and symmetrically with respect to the concentrator 151 and configured in such a way as to have a sensing axis in the plane XY, in particular along the axis X. Even though just one magnetoresistive element 152 or 154 is sufficient to enable operation of the magnetic-field sensor 150 as detector of magnetic fields along Z, the use of two or more magnetoresistive elements 152, 154 affords the advantage of eliminating the effect of a possible field interfering with the magnetoresistive elements 152, 154 parallel to the plane XY (and in particular along X in the example in FIG. 18a). FIG. 18a shows four magnetoresistive elements 152-155 for detection along Z, two of which are arranged symmetrically (along X) with respect to the magnetoresistive element 124a and the other two are arranged symmetrically (along X) with respect to the magnetoresistive element 124b. However, other arrangements are possible, for example, ones in which the magnetoresistive elements are staggered with respect to one another along X.

The magnetoresistors 152-155 are formed, according to one embodiment of the present disclosure, coplanar with the magnetoresistors 124a, 124b (i.e., the magnetoresistors 124a, 124b extend at a distance from the top surface 51a of the substrate 51 equal to the distance, once again from the top surface 51a, at which the magnetoresistors 152-155 extend). According to a further embodiment of the present disclosure, the magnetoresistors 152-155 are formed coplanar with the magnetoresistors 124c, 124d (i.e., the magnetoresistors 124c, 124d extend at a distance from the top surface 51a of the substrate 51 equal to the distance, once again from the top surface 51a, at which the magnetoresistors 152-155 extend). According to a further embodiment of the present disclosure, the magnetoresistors 152-155 are provided in a plane different from the plane in which the magnetoresistors 124a-124d are provided (i.e., the magnetoresistors 124a-124d extend at respective distances from the top surface 51a of the substrate 51 different from the distance, once again from the top surface 51a, to which the magnetoresistors 152-155 extend).

In detail, with reference by way of example to the magnetic-field sensor 150, a trench or cavity 153 extends within the substrate 51 from the top surface 51a as far as into the proximity of the bottom surface 51b, or vice versa.

The trench 153 is, according to one embodiment, set laterally staggered with respect to the magnetoresistive elements 124a, 124b, but can also be set (along Z) on top of the magnetoresistive elements 124a, 124b. The trench 153 houses the concentrator 151 formed by a layer of ferromagnetic material that covers the sides and the bottom of the trench 153. The concentrator 151 is made of a "soft" ferromagnetic material (i.e., one that can be magnetized easily and does not maintain the magnetization after the external magnetic field has been removed). For example, an amorphous cobalt-based alloy or else a permalloy can be used, typically not anisotropic, in particular with easy axis not aligned to the vertical wall (axis Z).

Figure 18B:
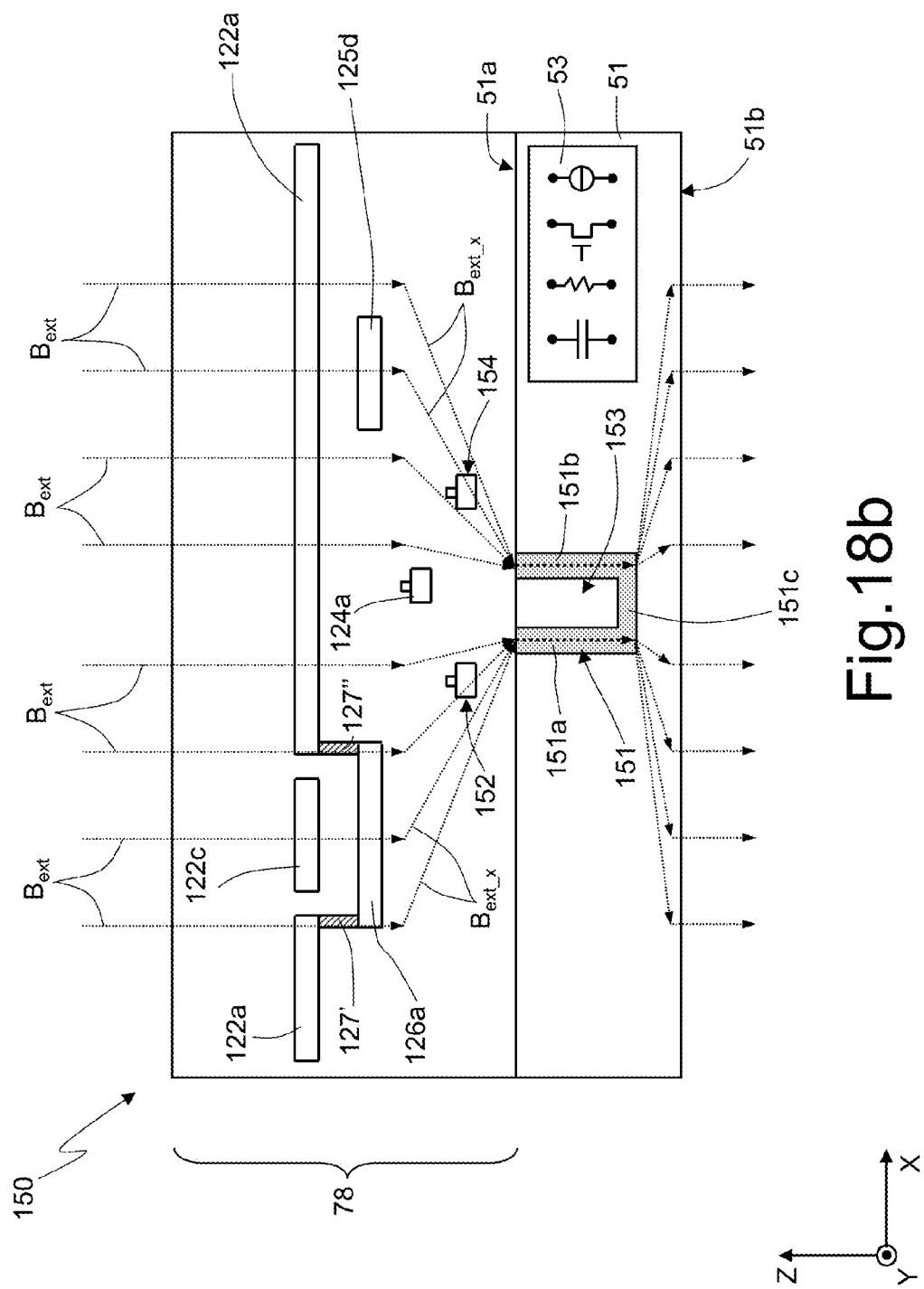

In the cross section of FIG. 18b, the concentrator 151 is substantially U-shaped with two arms 151a, 151b and a base 151c. The arms 151a, 151b cover and extend contiguous to the side walls of the trench 153, throughout the depth of the trench 153 itself; the base 151c covers and is contiguous to the bottom of the trench 153. The arms 151a, 151b have a principal dimension along the axis Z much greater than their thickness.

Consequently, when the sensor 150 is subjected to an external magnetic field $B_{ext}$ parallel to the axis Z, the arms 151a, 151b of the concentrator 151 cause a deflection of the lines of the field $B_{ext}$ and the generation of a horizontal field component $B_{ext\_x}$ parallel to the axis X and hence parallel to the plane of sensitivity of the magnetoresistive elements 152, 154. The horizontal component $B_{ext\_x}$ can thus be detected by the magnetoresistive elements by an external reading circuit in a known way.

Given that the concentrator 151 is made of ferromagnetic material, a magnetic circuit is created that favors the effect of concentration of the magnetic field and hence bestows high sensitivity on the sensor 150.

According to a further embodiment of the present disclosure, to improve further the insensitivity to magnetic fields oriented parallel to the plane XY it is possible to connect magnetoresistive elements having their own sensing axis oriented in one and the same direction to form a Wheatstone bridge. In detail, a sensor can comprise just one Wheatstone bridge, two Wheatstone bridges, or three Wheatstone bridges, according to the number of sensing axes required.

Figure 19:
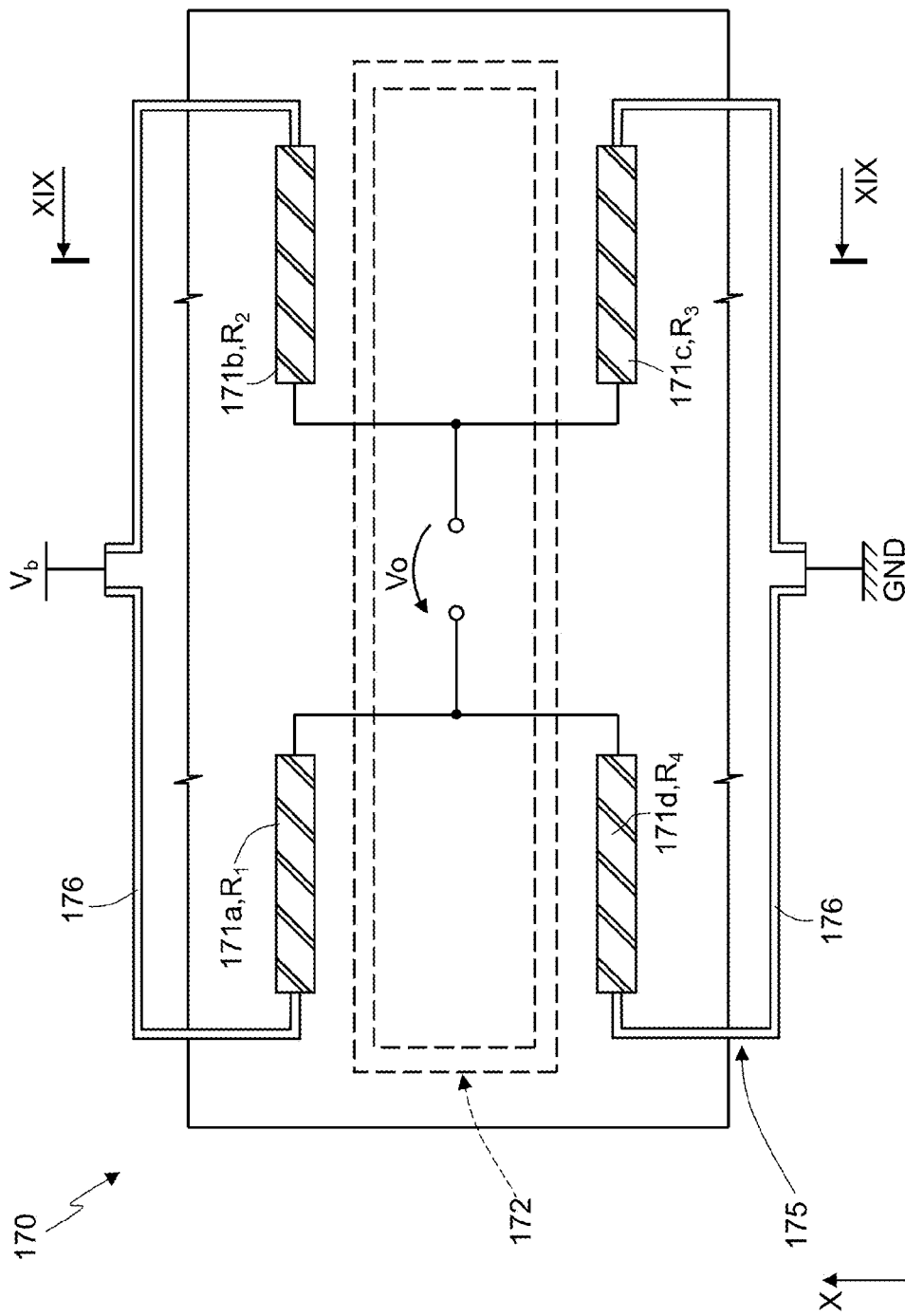
FIG. 19 shows the layout of an embodiment of the sensor of FIG. 17.

FIGS. 19 and 20 show (in top-plan view and in cross-sectional view along the line of cross section XIX-XIX, respectively) and by way of example, a magnetic-field sensor 170 provided with just one Wheatstone bridge and having a concentrator 172 similar to the concentrator 150 illustrated and described with reference to FIGS. 18a, 18b. The magnetic-field sensor 170 is designed to detect an external magnetic field $B_{ext}$ acting along Z.

The sensor 170 has four magnetoresistive elements 171a-171d connected to form a Wheatstone bridge 175, which is connected, by conductive paths 176, to biasing terminals Vb and GND and designed to supply an output signal Vo. Each magnetoresistive element 171a-171d constitutes a resistor R1-R4. The resistors R1-R4 are the same as one another as regards the geometrical and electrical characteristics of the magnetoresistive elements.

With the configuration of FIGS. 19, 20, the arms 172a, 172b of the concentrator 172 focus the external magnetic flux $B_{ext}$ so as to deflect the magnetic lines of flux and create field components parallel to the axis X but having opposite directions, given that they are guided through the ferromagnetic material of the magnetoresistive elements, following the path of least reluctance. Consequently, with an external magnetic field $B_{ext}$ oriented along Z and initial magnetization in the direction Y, the resistors R3, R4 see a field component along X having a first sign (e.g., positive) and the resistors R1, R2 see a field component along X having a second sign opposite to the first sign (e.g., negative). Hence, the resistance of the resistors R1, R3 decreases by ΔR, whilst the resistance of the resistors R2, R4 increases by ΔR. It follows that the output voltage from the Wheatstone bridge 175 is proportional to the variation of resistance and hence to the external magnetic field. Consequently, a purposely provided reading circuit, on the basis of the signal detected and the geometrical configuration, is able to determine the amplitude of the external magnetic field.

What has been described likewise applies to a sensor provided with a second and possibly a third Wheatstone bridge, the magnetoresistive elements of which are oriented so as to be sensitive to external fields acting along X and along Y.

Irrespective of the embodiment of the magnetic-field sensor, the latter can be produced in integrated form in an ASIC chip or in a chip separate from the ASIC chip and connected to the ASIC chip by bump connections (or via wire bonding). The ASIC chip comprises, in a known way, a plurality of active and/or passive electronic components integrated in the substrate. In particular, the electronic components form a supply and/or reading circuit in a magnetic-field sensor. The ASIC is configured for supplying the magnetoresistive elements with an input signal $V_{AL}$ designed to bias the magnetoresistive elements of the magnetic-field sensor. The ASIC is moreover configured for reading an output signal $V_{OUT}$ generated by the magnetoresistive elements in response to the input signal $V_{AL}$ and to a (possible) external magnetic field to be sensed.

The supply and reading ASIC is of a known type and comprises, for example, differential or fully differential resistive or switch-capacitor front ends, or in any case any circuit known in the literature designed for the purpose.

As has been said, according to one embodiment, the magnetic-field sensor (comprising the magnetoresistive elements and the magnetic-field generator) is integrated in a substrate different from the substrate of the ASIC chip and can be connected to the ASIC by bumps. For this purpose, the substrate of the ASIC and of the chip that carries the magnetic-field sensor have on the surface a respective plurality of terminals or pads configured for acting as interface between the ASIC and the magnetoresistive elements and the strap.

According to a further embodiment, the magnetic-field generator and the magnetoresistive elements are produced in integrated form in respective top metal levels of the ASIC chip. For example, the magnetoresistive elements are formed in the last metal level of the ASIC chip and the magnetic-field generator is formed in the immediately underlying metal level. According to this embodiment, bumps or other elements of connection between chips are not necessary, with the consequent advantage of reducing the parasitic capacitance.

The magnetic-field sensor according to any one of the embodiments described can be used in a compass, in linear position sensors, in angular position sensors, etc.

From an examination of the characteristics of the disclosure provided according to the present disclosure the advantages that it affords are evident.

In particular the overall size of the sensor can be considerably reduced so as to obtain a sensor having dimensions of surface area of less than 0.5×0.5 mm².

Furthermore, magnetoresistive elements not coplanar with respect to one another are formed in different steps of the manufacturing process. In this way, each of them can be formed by depositing ferromagnetic material in such a way as to obtain a magnetoresistive element, the easy axis of which is oriented as desired (in particular, orthogonal to the lines of magnetic field used for the set/reset operation). As a result, we obtain a sensor the sensitivity of which is improved (higher stability) and in which the set/reset procedure is more efficient.

Finally, it is clear that modifications and variations may be made to what has been described and illustrated herein, without thereby departing from the sphere of protection of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A magnetic-field sensor, comprising:
a substrate having a first surface and a second surface;
an insulating layer on the first surface;
a first magnetoresistor extending in the insulating layer and having a main axis of magnetization and a secondary axis of magnetization;
a second magnetoresistor extending in the insulating layer and having a main axis of magnetization and a secondary axis of magnetization, the main axis of magnetization of the second magnetoresistor extending in a direction transverse to the main axis of magnetization of the first magnetoresistor and the secondary axis of magnetization of the second magnetoresistor extending in a direction transverse to the secondary axis of magnetization of the first magnetoresistor;
a first magnetic-field generator configured to generate a first magnetic field having field lines along the main axis of magnetization of the first magnetoresistor; and
a second magnetic-field generator configured to generate a second magnetic field having field lines along the main axis of magnetization of the second magnetoresistor, wherein the first and second magnetoresistors extend in the insulating layer at respective first and second distances from the first surface, the first and second distances being different from one another.

2. The sensor according to claim 1, wherein the first magnetic-field generator and the second magnetic-field generator include respective first and second conductive strips that are mutually coplanar, the first and second conductive strips being electrically coupled to one another in a first intersection region.

3. The sensor according to claim 1, wherein the first and second magnetic-field generators include respective first conductive strips and second conductive strips that extend in the insulating layer at respective third and fourth distances, which are different from one another, from the first surface.

4. The sensor according to claim 3, wherein the first conductive strip of the first magnetic-field generator and the second conductive strip of the second magnetic-field generator extend in the insulating layer on respective first planes, at least partially aligned to one another along a first direction orthogonal to said respective first planes.

5. The sensor according to claim 4, wherein the first magnetoresistor and the second magnetoresistor extend into the insulating layer on respective second planes, at least partially aligned to one another along the first direction.

6. The sensor according to claim 1, further comprising first, second, third, and fourth conduction terminals, wherein:
the first magnetic-field generator includes a first conductive strip that extends between the first and second conduction terminals and is configured to generate in said first conductive strip a first electric current in a first conduction direction; and
the first magnetic-field generator includes a second conductive strip that extends between the third and fourth conduction terminals and is configured to generate in said second conductive strip an electric current in a second conduction direction, the main axis of magnetization of the first magnetoresistor being orthogonal to the first conduction direction and the main axis of magnetization of the second magnetoresistor being orthogonal to the second conduction direction.

7. The sensor according to claim 1, wherein the first magnetic-field generator includes:
a plurality of first conductive strips that are mutually coplanar;
a first electrical-connection portion; and
a plurality of first conductive vias extending in the insulating layer and respectively electrically coupling the first conductive strips to respective regions of said first electrical-connection portion.

8. The sensor according to claim 7, wherein the second magnetic-field generator includes:
a plurality of second conductive strips that are mutually coplanar;
a second electrical-connection portion; and
a plurality of second conductive vias extending in the insulating layer and respectively electrically coupling the second conductive strips to respective regions of said second electrical-connection portion, the first and second electrical-connection portions being mutually coplanar.

9. The sensor according to claim 8, wherein:
the first and second conductive strips extend in the insulating layer at respective third and fourth distances, which are different from one another, from the first surface
the first and second electrical-connection portions extend at a fifth distance from the first surface; and
said fifth distance is different from said third and fourth distances.

10. The sensor according to claim 7, wherein the first magnetoresistor includes a barber-pole structure that includes a ferromagnetic strip and a plurality of metal elements extending in a direction transverse to, and in electrical contact with, the ferromagnetic strip and being coplanar to said first electrical-connection portion.

11. The sensor according to claim 1, further comprising:
a first plurality of magnetoresistors having a main axis of magnetization parallel to the main axis of magnetization of the first magnetoresistor and a secondary axis of magnetization parallel to the secondary axis of magnetization of the first magnetoresistor; and
a second plurality of magnetoresistors having a main axis of magnetization parallel to the main axis of magnetization of the second magnetoresistor and a secondary axis of magnetization parallel to the secondary axis of magnetization of the second magnetoresistor, wherein said magnetoresistors belonging to the first plurality of magnetoresistors are electrically coupled to the first magnetoresistor to form a first Wheatstone bridge and said magnetoresistors belonging to the second plurality of magnetoresistors are electrically coupled to the second magnetoresistor to form a second Wheatstone bridge.

12. The sensor according to claim 1, further comprising a third magnetoresistor which extends into the insulating layer and has a main axis of magnetization and a secondary axis of magnetization and wherein the substrate includes a concentrator made of ferromagnetic material including at least one arm which extends in a direction transverse to the main axis of magnetization of the third magnetoresistor so as to deflect magnetic lines of flux oriented orthogonal to a plane identified by the main axis of magnetization and by the secondary axis of magnetization of the third magnetoresistor and generate components of magnetic field oriented parallel to the secondary axis of magnetization of the third magnetoresistor.

13. The sensor according to claim 12, wherein the third magnetoresistor extends into the insulating layer at a distance from the first surface different from said first distance and said second distance.

14. The sensor according to claim 12, wherein the third magnetoresistor extends into the insulating layer at a distance from the first surface equal to said first distance or said second distance.

15. A method of manufacturing a magnetic-field sensor, comprising:
forming an insulating layer on a first surface of a substrate;
forming, above the first surface of the substrate, a first magnetoresistor having a main axis of magnetization and a secondary axis of magnetization;
forming, above the first surface of the substrate, a second magnetoresistor having a main axis of magnetization and a secondary axis of magnetization, the main axis of magnetization of the second magnetoresistor extending in a direction transverse to the main axis of magnetization of the first magnetoresistor and the secondary axis of magnetization of the second magnetoresistor extending in a direction transverse to the secondary axis of magnetization of the first magnetoresistor;
forming, above the first surface of the substrate, a first magnetic-field generator configured to generate a first magnetic field having field lines along the main axis of magnetization of the first magnetoresistor;
forming, above the first surface of the substrate, a second magnetic-field generator configured to generate a second magnetic field having field lines along the main axis of magnetization of the second magnetoresistor,
wherein:
forming the first magnetoresistor includes forming the first magnetoresistor in the insulating layer at a first distance from the first surface; and
forming the second magnetoresistor forming the second magnetoresistor in the insulating layer at a second distance from the first surface, the first and second distances being different from one another.

16. The method according to claim 15, wherein forming the first and second magnetic-field generators include forming respective first and second conductive strips that are mutually coplanar, and in such a way that the first and second conductive strips are electrically coupled to one another at an area of intersection.

17. The method according to claim 15, wherein:
forming the first magnetic-field generator includes forming first conductive strips in the insulating layer at a third distance from the first surface; and
forming the second magnetic-field generator includes forming second conductive strips in the insulating layer at a fourth distance, different from the third distance, from the first surface.

18. The method according to claim 15, wherein forming the first conductive strip of the first magnetic-field generator and forming the second conductive strip of the second magnetic-field generator comprise forming the first and second conductive strips in the insulating layer on respective first planes, at least partially aligned to one another along a first direction orthogonal to said respective first planes.

19. The sensor according to claim 18, wherein forming the first magnetoresistor and forming the second magnetoresistor comprise forming the first and second magnetoresistors in the insulating layer on respective second planes, at least partially aligned to one another along the first direction.

20. An electronic device, comprising:
a magnetic-field sensor that includes:
a chip including a substrate having a first surface and a second surface and an insulating layer covering the first surface;
a first magnetoresistor extending in the insulating layer and having a main axis of magnetization and a secondary axis of magnetization;
a second magnetoresistor extending in the insulating layer and having a main axis of magnetization and a secondary axis of magnetization, the main axis of magnetization of the second magnetoresistor extending in a direction transverse to the main axis of magnetization of the first magnetoresistor and the secondary axis of magnetization of the second magnetoresistor extending in a direction transverse to the secondary axis of magnetization of the first magnetoresistor;
a first magnetic-field generator configured to generate a first magnetic field having field lines along the main axis of magnetization of the first magnetoresistor; and
a second magnetic-field generator configured to generate a second magnetic field having field lines along the main axis of magnetization of the second magnetoresistor, wherein the first and second magnetoresistors extend in the insulating layer at respective first and second distances from the first surface, the first and second distances being different from one another; and
a reader circuit electrically coupled to the magnetic-field sensor and configured to read the magnetic-field sensor.

21. The device according to claim 20, wherein the reader circuit is formed within the chip.

22. The device according to claim 20, wherein the first magnetic-field generator and the second magnetic-field generator include respective first and second conductive strips that are mutually coplanar, the first and second conductive strips being electrically coupled to one another in a first intersection region.

23. The device according to claim 20, wherein:
the first and second magnetic-field generators include respective first conductive strips and second conductive strips that extend in the insulating layer at respective third and fourth distances, which are different from one another, from the first surface; and
the first conductive strip of the first magnetic-field generator and the second conductive strip of the second magnetic-field generator extend in the insulating layer on respective first planes, at least partially aligned to one another along a first direction orthogonal to said respective first planes.

24. The device according to claim 20, wherein the first magnetic-field generator includes:
a plurality of first conductive strips that are mutually coplanar;
a first electrical-connection portion; and
a plurality of first conductive vias extending in the insulating layer and respectively electrically coupling the first conductive strips to respective regions of said first electrical-connection portion.

25. The device according to claim 24, wherein the second magnetic-field generator includes:
a plurality of second conductive strips that are mutually coplanar;
a second electrical-connection portion; and
a plurality of second conductive vias extending in the insulating layer and respectively electrically coupling the second conductive strips to respective regions of said second electrical-connection portion, the first and second electrical-connection portions being mutually coplanar.

26. The device according to claim 20, wherein:
the first and second conductive strips extend in the insulating layer at respective third and fourth distances, which are different from one another, from the first surface
the first and second electrical-connection portions extend at a fifth distance from the first surface; and
said fifth distance is different from said third and fourth distances.

27. The device according to claim 20, wherein:
the magnetic-field sensor includes a third magnetoresistor which extends into the insulating layer and has a main axis of magnetization and a secondary axis of magnetization: and
the chip houses a concentrator made of ferromagnetic material including at least one arm which extends in a direction transverse to the main axis of magnetization of the third magnetoresistor so as to deflect magnetic lines of flux oriented orthogonal to a plane identified by the main axis of magnetization and by the secondary axis of magnetization of the third magnetoresistor and generate components of magnetic field oriented parallel to the secondary axis of magnetization of the third magnetoresistor.

* * * * *